United States Patent
Brown et al.

(10) Patent No.: US 8,956,976 B2
(45) Date of Patent: Feb. 17, 2015

(54) METHODS OF PROCESSING SEMICONDUCTOR SUBSTRATES IN FORMING SCRIBE LINE ALIGNMENT MARKS

(71) Applicant: Micron Technology, Inc., Boise, ID (US)

(72) Inventors: William R. Brown, Boise, ID (US); David Kewley, Boise, ID (US); Adam Olson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/171,848

(22) Filed: Feb. 4, 2014

(65) Prior Publication Data

US 2014/0154886 A1    Jun. 5, 2014

Related U.S. Application Data

(62) Division of application No. 13/196,524, filed on Aug. 2, 2011, now Pat. No. 8,673,780, which is a division of application No. 12/622,171, filed on Nov. 19, 2009, now Pat. No. 8,003,482.

(51) Int. Cl.
*H01L 21/302* (2006.01)
*H01L 21/308* (2006.01)
(Continued)

(52) U.S. Cl.
CPC .............. *H01L 21/308* (2013.01); *G03F 9/708* (2013.01); *G03F 9/7084* (2013.01); *H01L 21/0337* (2013.01); *H01L 21/3086* (2013.01)
USPC ................... 438/689; 438/759; 257/E21.214; 257/E21.231

(58) Field of Classification Search
USPC .............. 438/401, 462, 689, 759, 736, 758; 430/22, 314
See application file for complete search history.

(56) References Cited

U.S. PATENT DOCUMENTS

| | | |
|---|---|---|
| 5,328,810 A | 7/1994 | Lowrey et al. |
| 5,773,196 A | 6/1998 | Shih |

(Continued)

FOREIGN PATENT DOCUMENTS

| | | |
|---|---|---|
| EP | 1775771 | 4/2007 |
| JP | 2004363121 | 12/2004 |

(Continued)

OTHER PUBLICATIONS

Ikeda et al., "Mechanical Stress Control in a VLSI-Fabrication Process: A Method for Obtaining the Relation Between Stress Levels and Stress-Induced Failures", IEEE Transactions on Semiconductor Manufacturing vol. 16, No. 4, pp. 696-703, May 2003.

(Continued)

*Primary Examiner* — Savitr Mulpuri
(74) *Attorney, Agent, or Firm* — Wells St. John, P.S.

(57) ABSTRACT

A method of processing a semiconductor substrate in forming scribe line alignment marks includes forming pitch multiplied non-circuitry features within scribe line area of a semiconductor substrate. Individual of the features, in cross-section, have a maximum width which is less than a minimum photolithographic feature dimension used in lithographically patterning the substrate. Photoresist is deposited over the features. Such is patterned to form photoresist blocks that are individually received between a respective pair of the features in the cross-section. Individual of the features of the respective pairs have a laterally innermost sidewall in the cross-section. Individual of the photoresist blocks have an opposing pair of first pattern edges in the cross-section that are spaced laterally inward of the laterally innermost sidewalls of the respective pair of the features. Individual of the photoresist blocks have an opposing pair of second pattern edges in the cross-section that self-align laterally outward of the first pattern edges to the laterally innermost sidewalls of the features during the patterning.

7 Claims, 22 Drawing Sheets

(51) Int. Cl.
*G03F 9/00* (2006.01)
*H01L 21/033* (2006.01)

(56) References Cited

U.S. PATENT DOCUMENTS

| | | | |
|---|---|---|---|
| 6,118,167 | A | 9/2000 | DiSimone et al. |
| 6,180,466 | B1 | 1/2001 | Ibok |
| 6,207,473 | B1 | 3/2001 | Hirai et al. |
| 6,221,733 | B1 | 4/2001 | Li et al. |
| 6,355,524 | B1 | 3/2002 | Tuan et al. |
| 6,642,125 | B2 | 11/2003 | Oh et al. |
| 6,740,933 | B2 | 5/2004 | Yoo et al. |
| 6,764,922 | B2 | 7/2004 | Beyer et al. |
| 6,919,260 | B1 | 7/2005 | Umezawa et al. |
| 7,112,849 | B2 | 9/2006 | Ahn et al. |
| 7,229,896 | B2 | 6/2007 | Chen et al. |
| 7,408,265 | B2 | 8/2008 | Holscher et al. |
| 7,611,944 | B2 | 11/2009 | Tran et al. |
| 7,846,812 | B2 | 12/2010 | Hill |
| 8,236,697 | B2 | 8/2012 | Chang et al. |
| 2001/0021567 | A1 | 9/2001 | Takahashi |
| 2002/0022340 | A1 | 2/2002 | Lin |
| 2003/0006475 | A1 | 1/2003 | Tseng |
| 2003/0054608 | A1 | 3/2003 | Tseng et al. |
| 2003/0209760 | A1 | 11/2003 | Maruyama |
| 2003/0223630 | A1 | 12/2003 | Adel et al. |
| 2004/0038495 | A1 | 2/2004 | Wieczorek et al. |
| 2004/0178450 | A1 | 9/2004 | Lee et al. |
| 2005/0277257 | A1 | 12/2005 | Byun et al. |
| 2006/0046407 | A1 | 3/2006 | Juengling |
| 2006/0046422 | A1 | 3/2006 | Tran et al. |
| 2006/0057815 | A1 | 3/2006 | Kim |
| 2006/0068542 | A1 | 3/2006 | Orlowski et al. |
| 2006/0264003 | A1 | 11/2006 | Eun |
| 2006/0286750 | A1 | 12/2006 | Fang et al. |
| 2007/0049011 | A1 | 3/2007 | Tran |
| 2007/0117310 | A1 | 5/2007 | Bai et al. |
| 2007/0148984 | A1 | 6/2007 | Abatchev et al. |
| 2007/0161207 | A1 | 7/2007 | Park |
| 2007/0161251 | A1 | 7/2007 | Tran et al. |
| 2007/0178664 | A1 | 8/2007 | Tseng et al. |
| 2007/0221950 | A1 | 9/2007 | Suzuki et al. |
| 2007/0238260 | A1 | 10/2007 | Yang |
| 2007/0238299 | A1 | 10/2007 | Niroomand et al. |
| 2007/0252175 | A1 | 11/2007 | Tang et al. |
| 2008/0085600 | A1 | 4/2008 | Furukawa et al. |
| 2008/0227234 | A1 | 9/2008 | Yoshino |
| 2010/0130010 | A1 | 5/2010 | Park et al. |

FOREIGN PATENT DOCUMENTS

| | | |
|---|---|---|
| JP | 2007073985 | 3/2007 |
| KR | 2001-0030009 | 4/2001 |
| KR | 2002-0022120 | 3/2002 |
| KR | 10-2005-0014164 A | 2/2005 |
| TW | 379412 | 1/2000 |
| TW | 247377 B | 1/2006 |
| TW | 265589 B | 11/2006 |

OTHER PUBLICATIONS

Kim et al., "High-Density Trench DMOSFETs Employing Two Step Trench Technique and Trench Contact Structure", IEEE 15th International Symposium on Power Semiconductor Devices and ICs, pp. 165-168, Apr. 2003.

Park et al., "A Novel Shallow Trech Isolation Technoklogy Using LPCVD MTO/SiN Liner in SOI wafer", IEEE International SOI Conference, pp. 83-84, 2001.

METHODS OF PROCESSING SEMICONDUCTOR SUBSTRATES IN FORMING SCRIBE LINE ALIGNMENT MARKS

RELATED PATENT DATA

This patent resulted from a divisional application of U.S. patent application Ser. No. 13/196,524, filed Aug. 2, 2011, entitled "Methods of Processing Semiconductor Substrates In Forming Scribe Line Alignment Marks", naming William R. Brown, David A. Kewley and Adam Olson as inventors, which is a divisional application of U.S. patent application Ser. No. 12/622,171, filed Nov. 19, 2009, now U.S. Pat. No. 8,008,342, entitled "Methods of Processing Semiconductor Substrates In Forming Scribe Line Alignment Marks", naming William R. Brown, David A. Kewley and Adam Olson as inventors, the disclosures of which are incorporated by reference.

TECHNICAL FIELD

Embodiments disclosed herein pertain to methods of processing semiconductor substrates in forming scribe line alignment marks.

BACKGROUND

Scribe line alignment marks are used in the fabrication of integrated circuitry to precisely align the substrates with respect to reticles which are used to pattern the substrates. At least two of such marks are placed within scribe line area of the substrate between integrated circuit die area. Each alignment mark typically includes a plurality of raised and/or lowered features for which a stepper/scanner can optically search to determine and/or modify x-y alignment of the substrate for subsequent processing. The individual spaced features within an alignment mark are typically spaced rectangles, although any configuration might alternately be used.

X-y substrate alignment may occur by direct or indirect methods. With indirect alignment, scribe line alignment marks are initially formed relative to a substrate. Multiple layers are separately provided thereover and may be separately lithographically patterned. In doing so, each time the substrate is x-y aligned, reference may be made to the initially formed alignment marks. Such a method is referred to as "indirect" as each succeeding layer is not referenced to the immediately preceding layer. There are, however, certain critical mask levels which should be patterned relative to an immediately underlying layer. Accordingly, scribe line alignment marks may be fabricated relative to an immediate underlying layer and x-y alignment determined therefrom before patterning a subsequent layer. Such is referred to as "direct alignment".

The continuing reduction in the feature sizes of circuit components places ever greater demands on the techniques used to form those features. Photolithography is still commonly used to form patterned features such as conductive lines. A concept commonly referred to as "pitch" can be used to describe the sizes of the features in conjunction with spaces immediately adjacent thereto. Pitch may be defined as the distance between an identical point in two neighboring features of a repeating pattern in a straight line cross-section, thereby including the maximum width of the feature and the space to the next immediately adjacent feature. However, due to factors such as optics and light or radiation wave length, photolithography techniques tend to have a minimum pitch below which a particular photolithographic technique cannot reliably form features. Thus, minimum pitch of a photolithographic technique is an obstacle to continued feature size reduction using photolithography.

Pitch doubling or pitch multiplication is one method which extends the capabilities of photolithographic techniques beyond their minimum pitch. Such forms featured narrower than minimum photolithography resolution by depositing spacer-forming layers to have a lateral thickness (width) which is less than that of the minimum capable photolithographic feature size. The spacer-forming layers are then anisotropically etched to form sub-lithographic width features, and then the features which were formed at the minimum photolithographic feature size are etched from the substrate.

In forming scribe line alignment marks where sub-lithographic pitch multiplied features are formed, such may result in very narrow width features on the order of 50 nanometers and less that may be spaced more than a thousand nanometers apart. This makes it difficult or impossible for the scanners to view such features of scribe line alignment marks, thus precluding use of direct alignment techniques unless separate, dedicated masking for alignment marks is used.

While the invention was motivated in addressing the above-identified issues, the invention is in no way limited in overcoming some or all of the above-identified drawbacks. Rather, the invention is encompassed by the accompanying claims as literally worded and in accordance with the doctrine of equivalents.

DETAILED DESCRIPTION OF EXAMPLE EMBODIMENTS

Example embodiments of methods of processing a semiconductor substrate in forming scribe line alignment marks in accordance with the invention are initially described with reference to FIGS. 1-11 with respect to a substrate fragment 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 1:
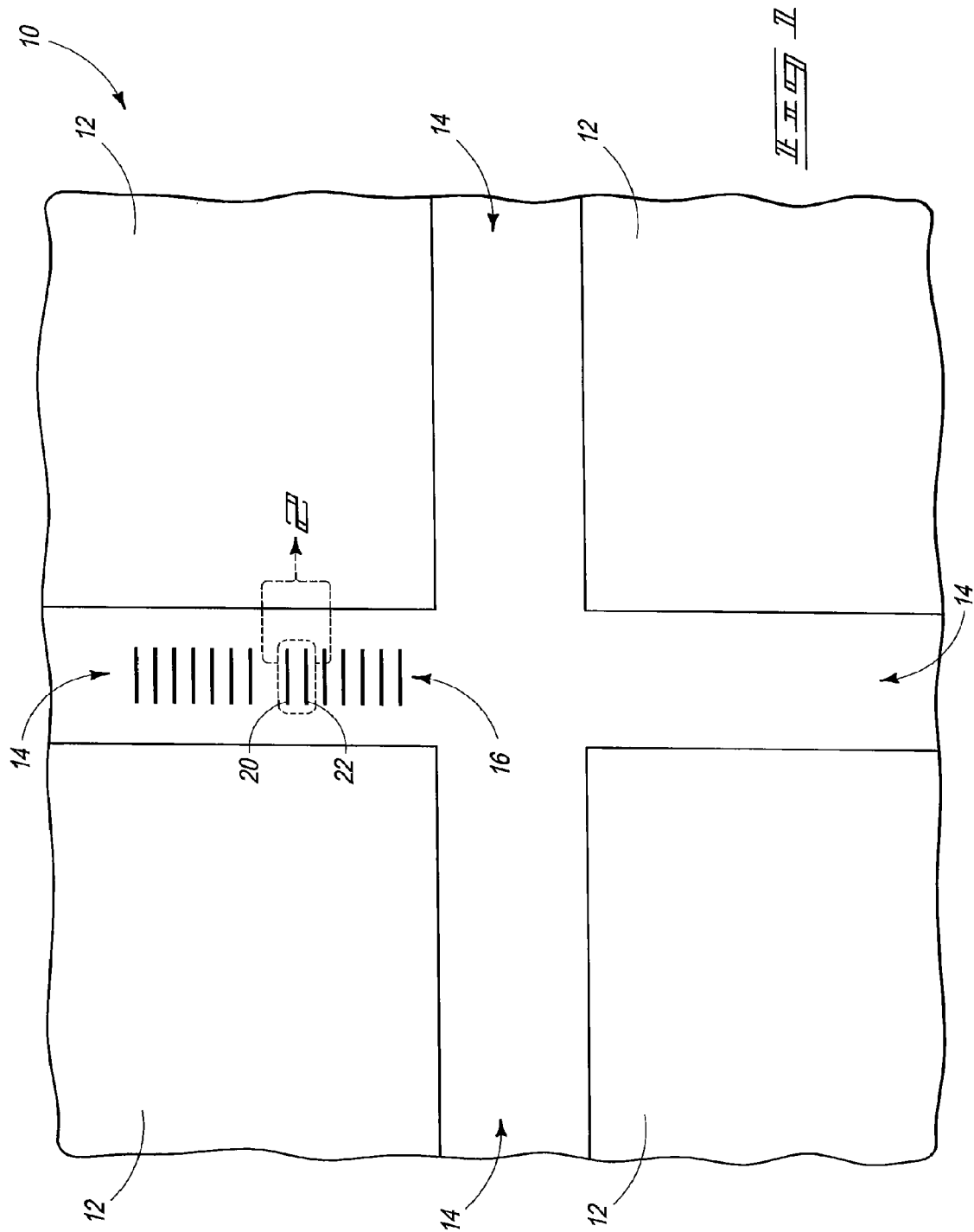
FIG. 1 is a diagrammatic top plan view of a semiconductor substrate fragment in the processing of scribe line alignment marks in accordance with an embodiment of the invention.

Referring to FIG. 1, substrate fragment 10 comprises die area 12 within which integrated circuit die are to be fabricated, and scribe line area 14 therebetween. An uncompleted scribe line alignment mark 16 in fabrication is received within scribe line area 14. One or more of the same or other alignment marks may be fabricated elsewhere within scribe line area on the substrate.

Figure 2:
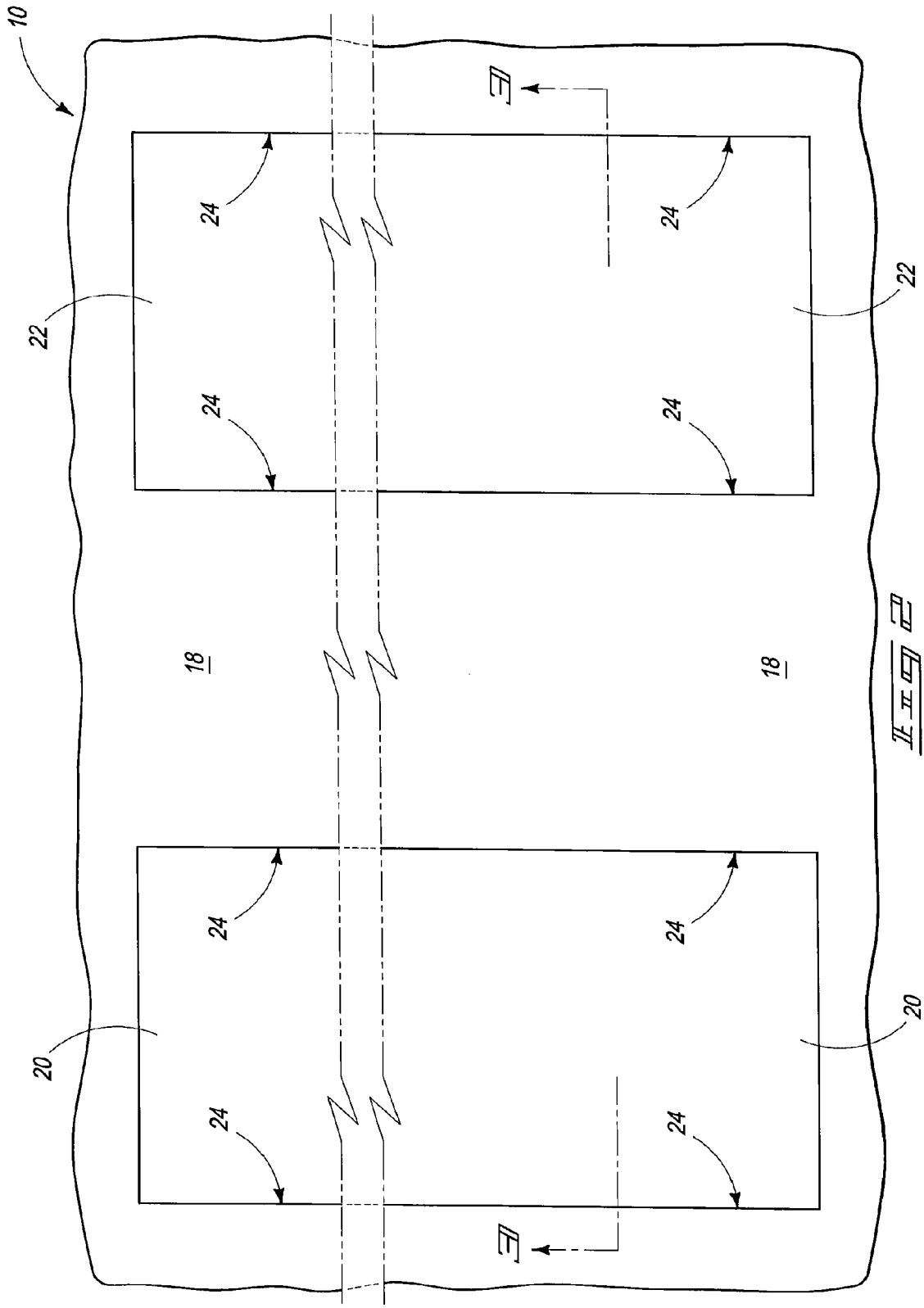
FIG. 2 is an enlarged diagrammatic top plan view of a portion of the semiconductor substrate fragment of FIG. 1.
Figure 3:
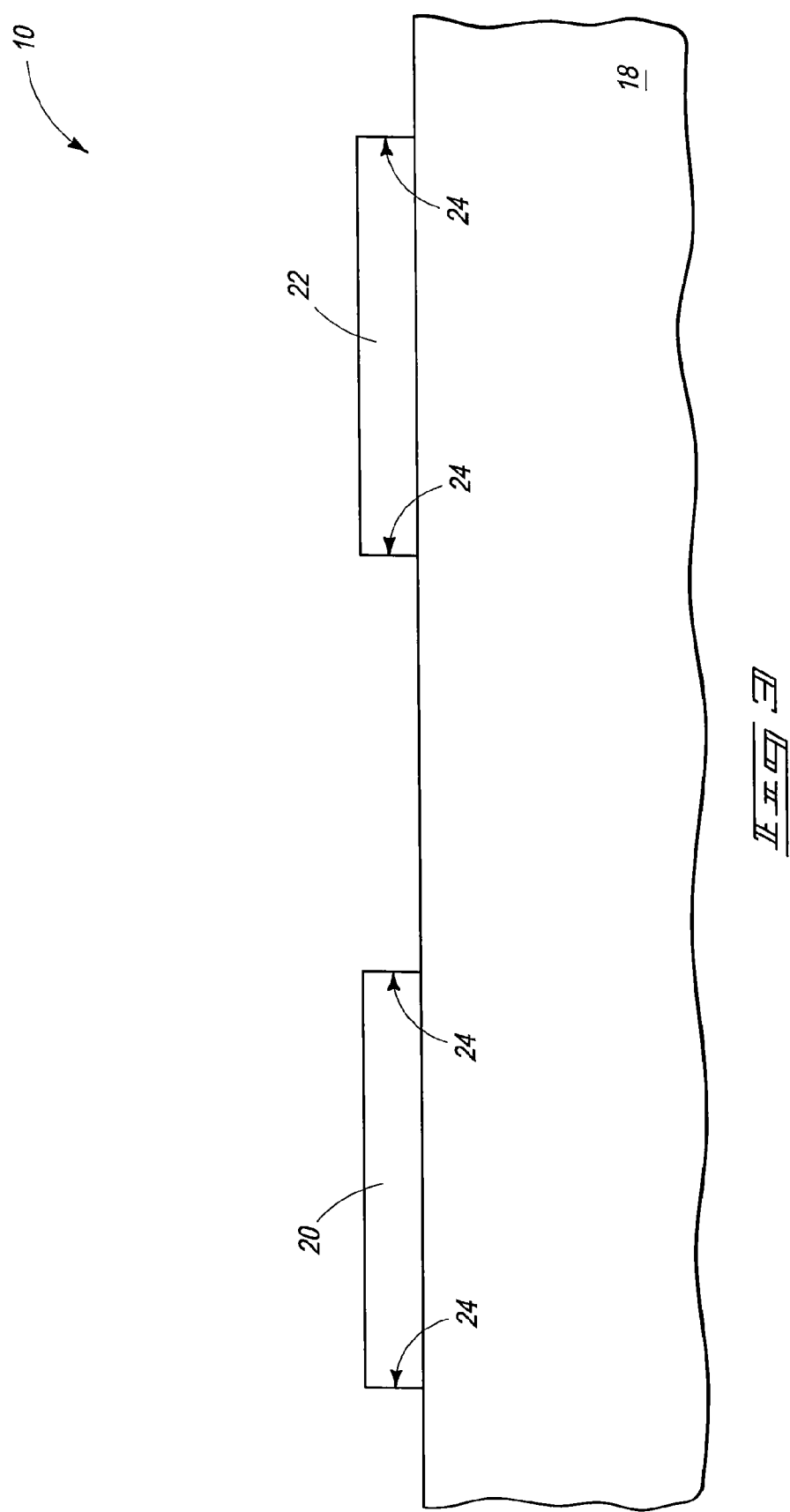
FIG. 3 is a sectional view taken through line 3-3 in FIG. 2.

Referring to FIGS. 1-3, semiconductor substrate 10 is depicted, by way of example only, as comprising a monolithic substrate 18 within and upon which integrated circuit device components (not shown) have been or will be fabricated. Accordingly, substrate 18 may comprise multiple different compositions, regions, and layers of any of insulative, semiconductive, and/or conductive materials. Photoresist has been deposited and patterned over substrate material 18 to form first photoresist blocks 20, 22 in the depicted cross-section. Alternate constructions are contemplated, as will be apparent in the continuing discussion. An example thickness range for first photoresist blocks 20, 22 is from about 600 Angstroms to 2,000 Angstroms, with 900 Angstroms being a specific example. In some embodiments, blocks 20, 22 may comprise material in addition to or other than photoresist. First photoresist blocks 20, 22 may be considered as having opposing laterally outermost sidewalls 24.

Figure 4:
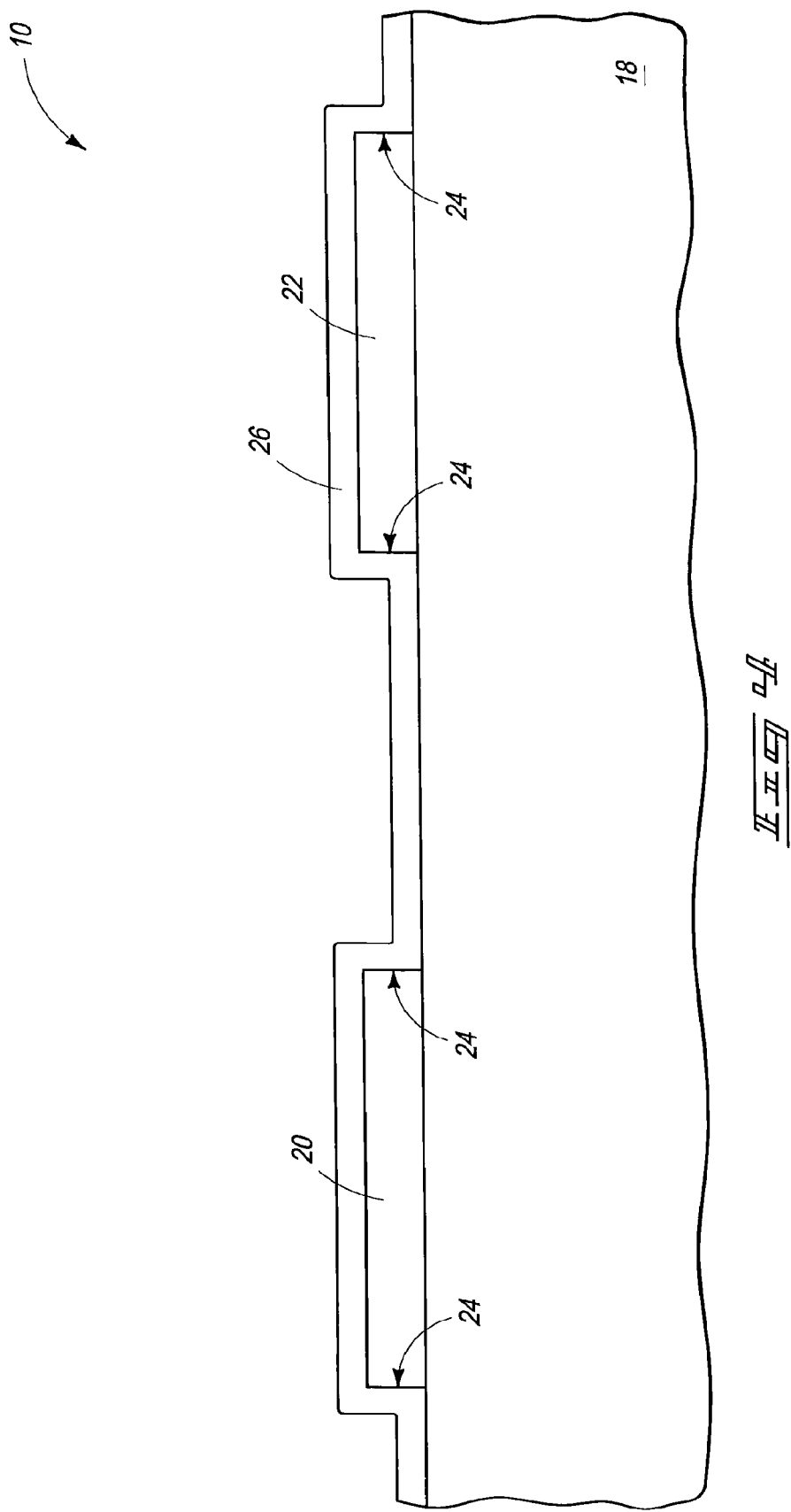
FIG. 4 is a view of the FIG. 3 substrate fragment at a processing step subsequent to that shown by FIG. 3.

Referring to FIG. 4, material 26 has been deposited over first photoresist blocks 20, 22. Such may comprise any one or combination of conductive, semiconductive, and/or insulative materials, with silicon dioxide being a specific example. In some embodiments, material 26 is deposited to a thickness which is less than a minimum photolithographic feature dimension that is used in lithographically patterning any of the substrate in the fabrication of integrated circuitry. As one example where minimum resolvable photolithographic feature dimension is about 60 nanometers, an example deposition thickness for material 26 is about 21 nanometers. Width or distance between laterally outermost sidewalls 24 of blocks 20, 22 may, for example, be substantially greater, with from 1 micron to 2 microns being an example.

Figure 5:
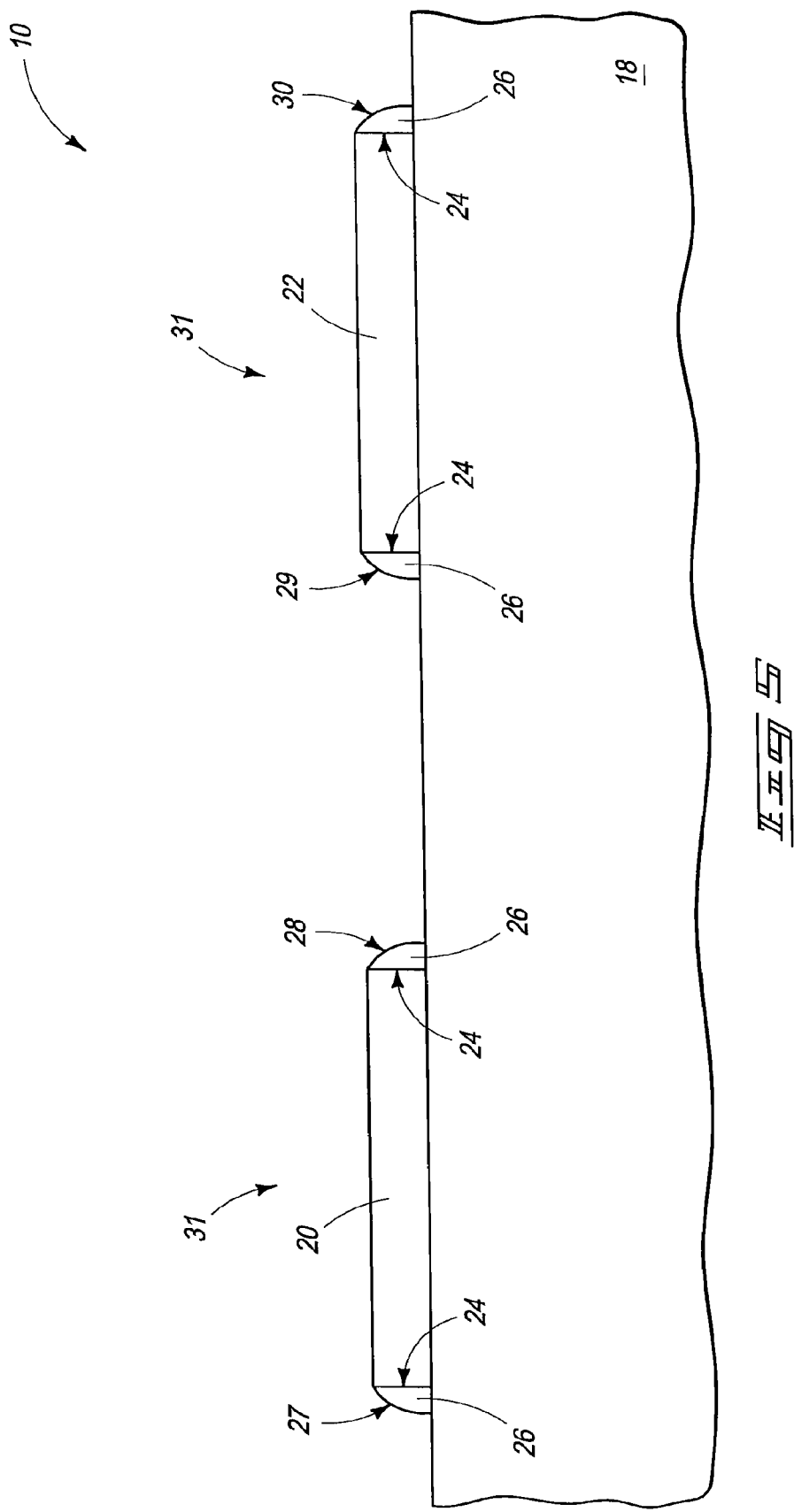
FIG. 5 is a view of the FIG. 4 substrate fragment at a processing step subsequent to that shown by FIG. 4.

Referring to FIG. 5, material 26 has been anisotropically etched to form spacers 27, 28, 29 and 30 which are respectively received over each of laterally outermost sidewalls 24 in the cross-section. In one embodiment, individual of spacers 27, 28, 29, 30 in the cross-section have a maximum width which is less than the minimum photolithographic feature dimension used in lithographically patterning the substrate. Regardless, FIG. 5 depicts an example embodiment of forming non-circuitry first features 31 within a scribe line area of a semiconductor substrate. Material of blocks 20, 22 and material 26 may also be used in fabricating components, masks, or other structures within die circuitry area 12 (FIG. 1) simultaneously with the fabrication of non-circuitry first features 31.

Figure 6:
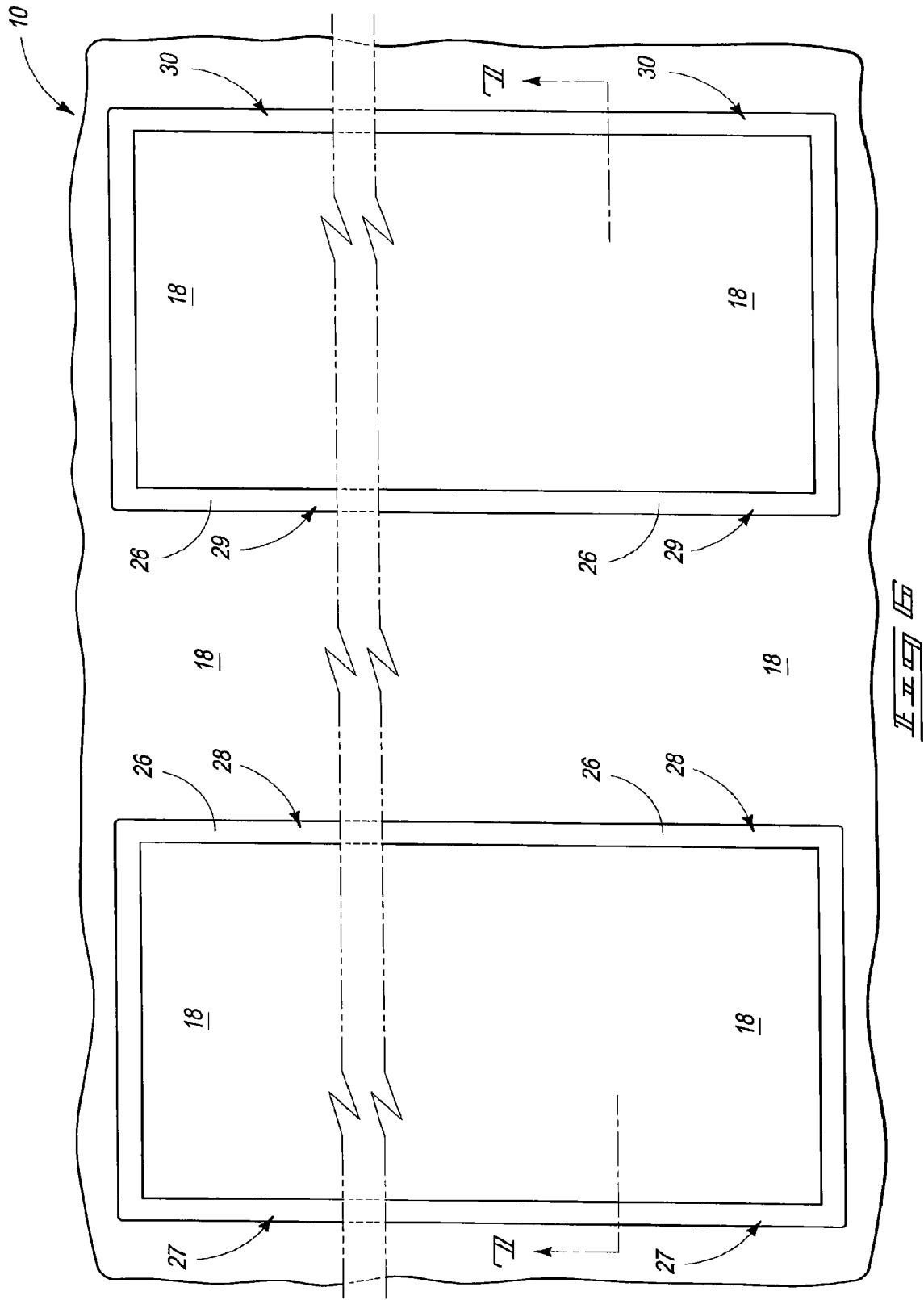
FIG. 6 is a diagrammatic top plan view of the FIG. 5 substrate fragment at a processing step subsequent to that shown by FIG. 5.
Figure 7:
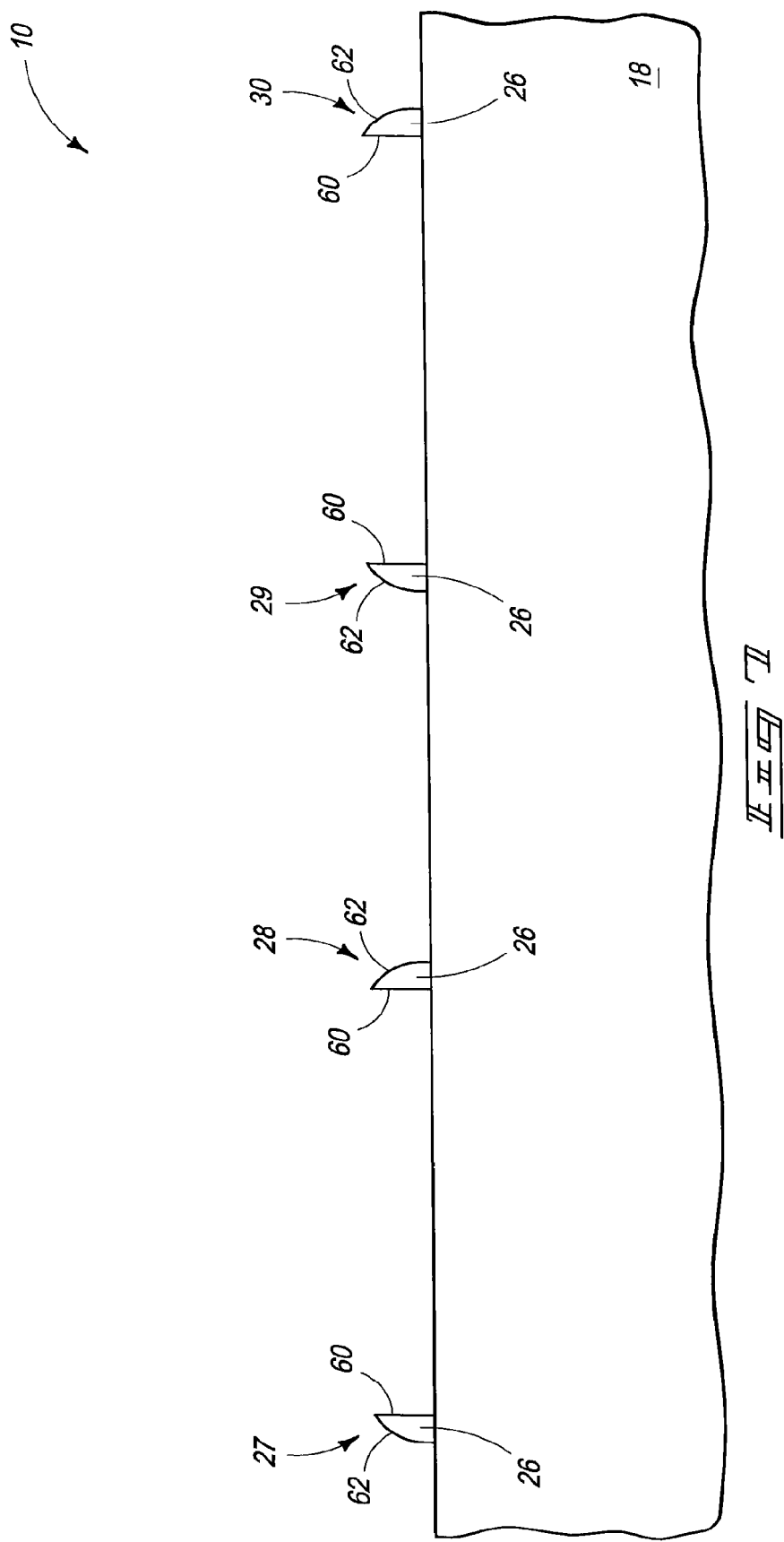
FIG. 7 is a sectional view taken through line 7-7 in FIG. 6.

Referring to FIGS. 6 and 7, first photoresist blocks 20, 22 (not shown) have been removed from substrate 10. Such is in one embodiment but one example of forming pitch multiplied non-circuitry features 27, 28, 29, 30 within scribe line area of a semiconductor substrate wherein individual of the features in cross-section have a maximum width which is less than a minimum photolithographic feature dimension used in lithographically patterning the substrate. Such may be fabricated by any other existing or yet-to-be developed technique.

Figure 8:
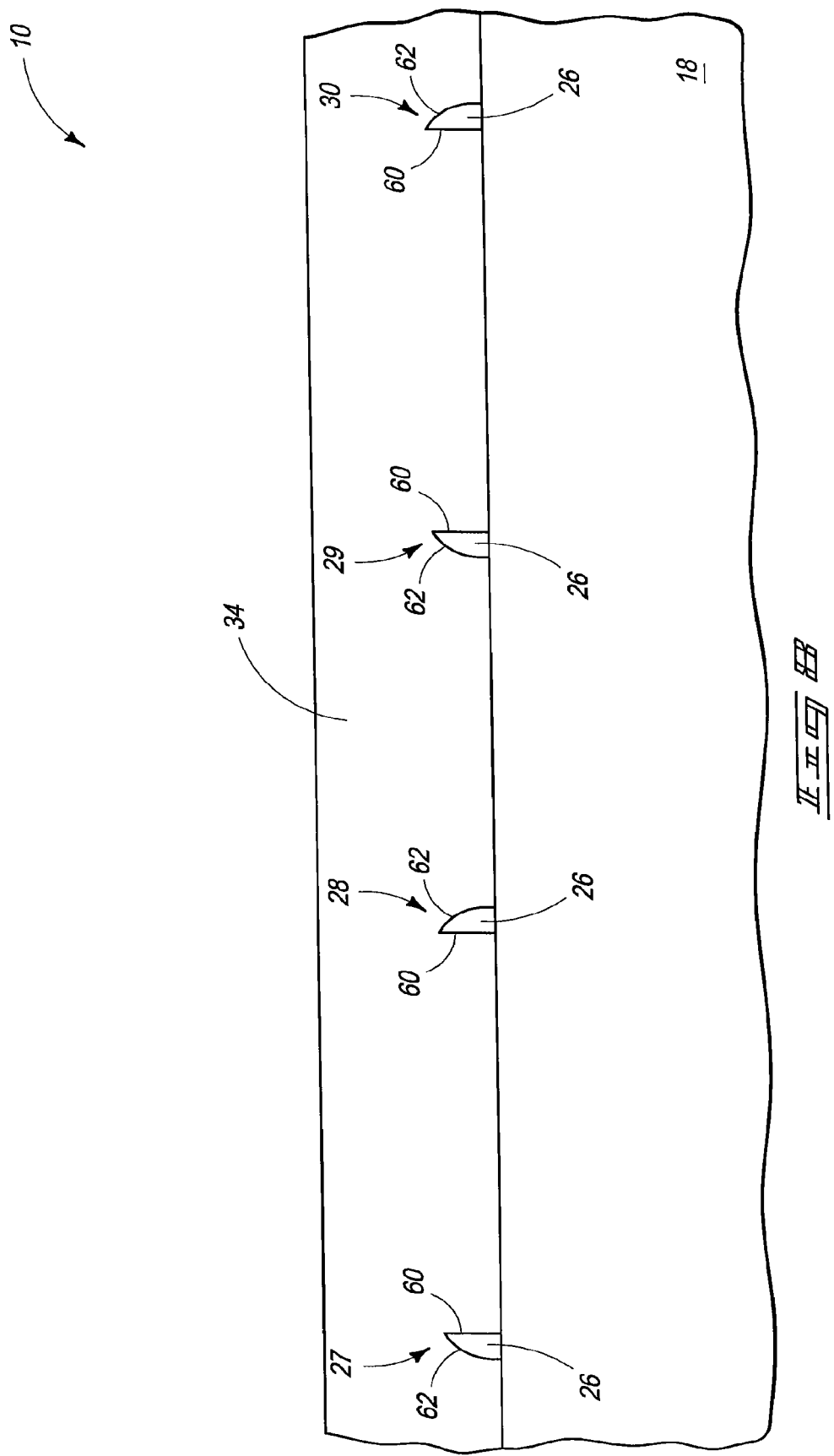
FIG. 8 is a view of the FIG. 7 substrate fragment at a processing step subsequent to that shown by FIG. 7.

Referring to FIG. 8, second photoresist 34 has been deposited over spacers/features 27, 28, 29, 30. Second photoresist 34 may be of the same or different composition as the photoresist of first photoresist blocks 20, 22. Second photoresist 34 may be provided to the same or different thickness as first photoresist blocks 20, 22. An example thickness range is from about 1,000 Angstroms to 2,000 Angstroms, with 1,650 Angstroms being a specific example.

Figure 9:
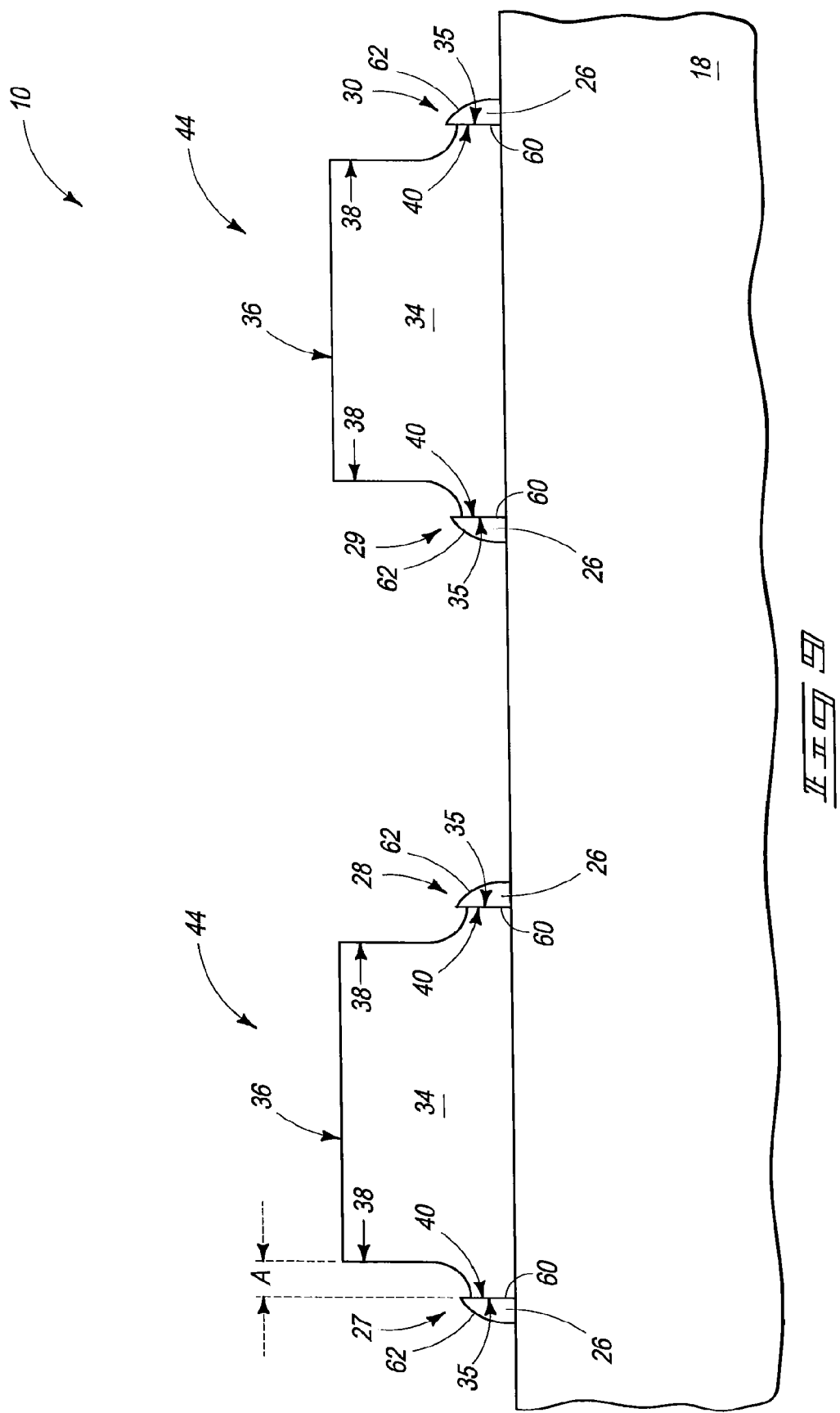
FIG. 9 is a view of the FIG. 8 substrate fragment at a processing step subsequent to that shown by FIG. 8.

Referring to FIG. 9, photoresist 34 has been patterned to form photoresist blocks 36 that are individually received between a respective pair 27, 28 and 29, 30 of features 27, 28, 29, 30 in the depicted cross-section. Second photoresist 34 may be deposited over die area 12 (FIG. 1) of the semiconductor substrate, and simultaneously patterned over such die area for formation of integrated circuit components while patterning to form photoresist blocks 36. For purposes of the continuing discussion, individual of features/spacers 27, 28, 29, 30 of the respective pairs 27, 28 and 29, 30 may be considered as having a laterally innermost sidewall 35 in the cross-section. Individual of photoresist blocks 36 may be considered as having an opposing pair of first pattern edges 38 in the cross-section that are spaced laterally inward of laterally innermost sidewalls 35 of the respective pairs 27, 28 and 29, 30 of features/spacers 27, 28, 29, 30.

In one embodiment, individual of photoresist blocks 36 may be considered as having an opposing pair of second pattern edges 40 in the cross-section that self-align laterally outward of first pattern edges 38 to laterally innermost sidewalls 35 of features/spacers 27, 28, 29, 30 during the patterning to form photoresist blocks 36. For example, optical artifact effects during patterning of a photoresist 34 using a mask/reticle that defines edges 38 can cause the resultant pattern in such photoresist to appear largely as shown wherein edges 40 essentially migrate laterally outward to self-align against a proximate feature, such as features 27, 28, 29, 30. Each of proximity of the inner spacer edge 35 to the mask defined edge 38 of the mask pattern, the thickness of photoresist 34, and the wave length of incident radiation used to pattern photoresist 34 impacts the degree to which a photoresist edge 40 will migrate laterally outward to self-align with an immediately adjacent feature. For example, each of closer proximity of pattern edge 38 to feature/spacer edge 35, thicker photoresists, longer patterning wave lengths, and quadapole illumination tend to increase degree by which second pattern edges 40 will migrate/self-align laterally outward to features/spacers 27, 28, 29, 30.

FIG. 9 depicts a dimension "A" defining the laterally inward spacing of innermost sidewalls 35 of any of features/spacers 27, 28, 29, 30 from first pattern edges 38. In one embodiment, dimension A is no more than 100 nanometers, and in one embodiment is no more than 50 nanometers. In one embodiment, dimension A is at least 25 nanometers, for example, to preclude risk due to misalignment tolerances of first pattern edges 38 aligning directly over elevationally outermost surfaces of features/spacers 27, 28, 29, 30. In one embodiment, dimension A is no more than 2.0 times the maximum widths of features/spacers 27, 28, 29, 30, and in one embodiment is no more than 1.5 times such maximum widths.

In a reduction to practice example, SAIL-X140 photoresist available from Shin Etsu of Niigata, Japan was deposited to a thickness of 1,650 Angstroms, and patterned with incident radiation having a wave length of 193 nanometers. The maximum width of the respective features/spacers 27, 28, 29, 30 was 21 nanometers, with dimension A targeted to be 35 nanometers with a mask misalignment tolerance in defining edges 38 being about 25 nanometers. Distance between the laterally outermost edges of spacer/feature pairs 27/28 and 29/30 was 1,600 nanometers, with space between depicted immediately adjacent features/spacers 28, 29 also being about 1,600 nanometers.

Substrate 10 in FIG. 9 may be considered as comprising second features 44 in the cross-section which comprise second photoresist blocks 36 having laterally outermost opposing sidewalls 40. Such may be so considered regardless of whether spacers/features 27, 28, 29, 30 are sub-lithographic in width and regardless of the presence of first pattern edges 38. Respective ones of spacers 27, 28, 29, 30 formerly received against one of laterally outermost sidewalls 24 of first photoresist blocks 20, 22 are received against respective opposing laterally outermost sidewalls 40 of second photoresist blocks 36 in the cross-section.

Figure 10:
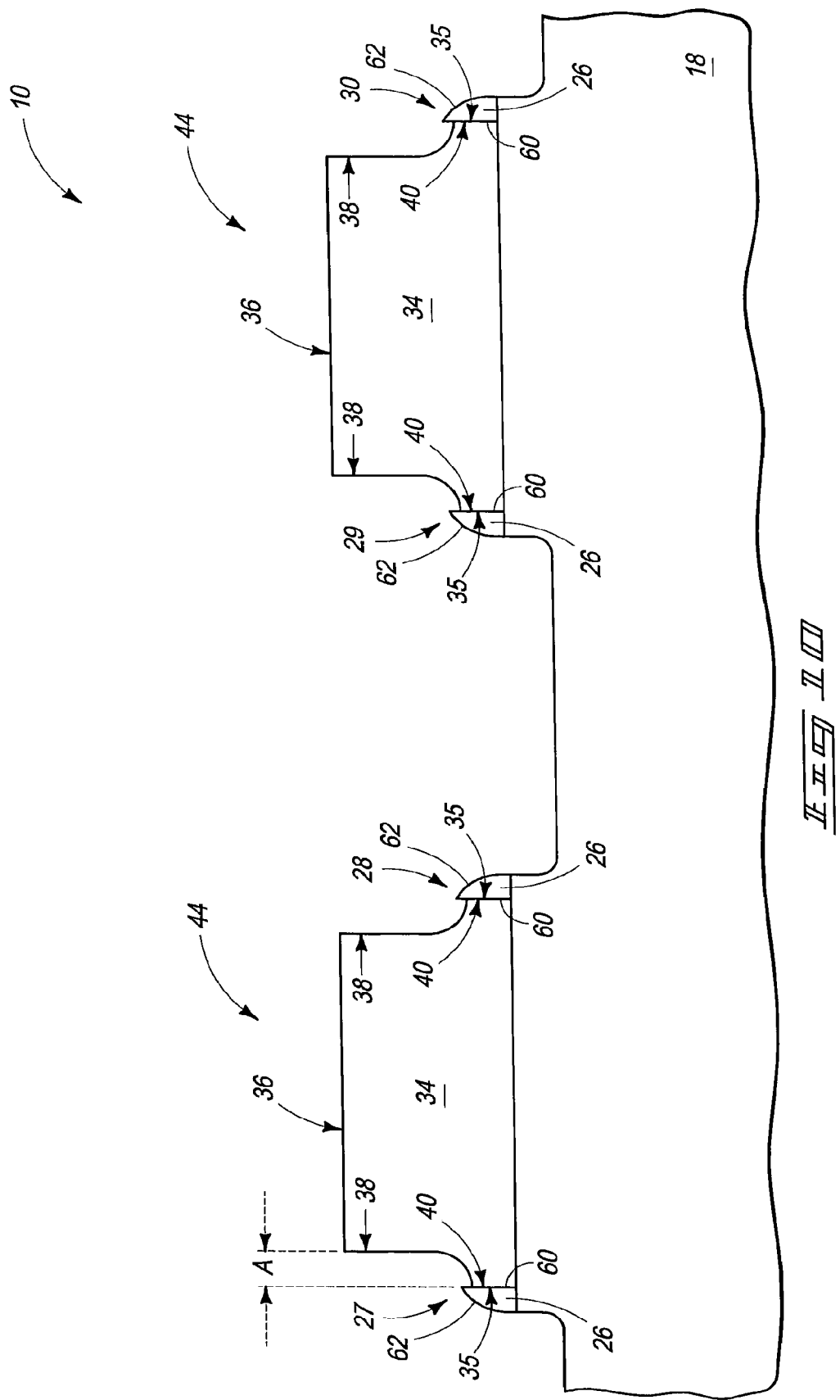
FIG. 10 is a view of the FIG. 9 substrate fragment at a processing step subsequent to that shown by FIG. 9.
Figure 11:
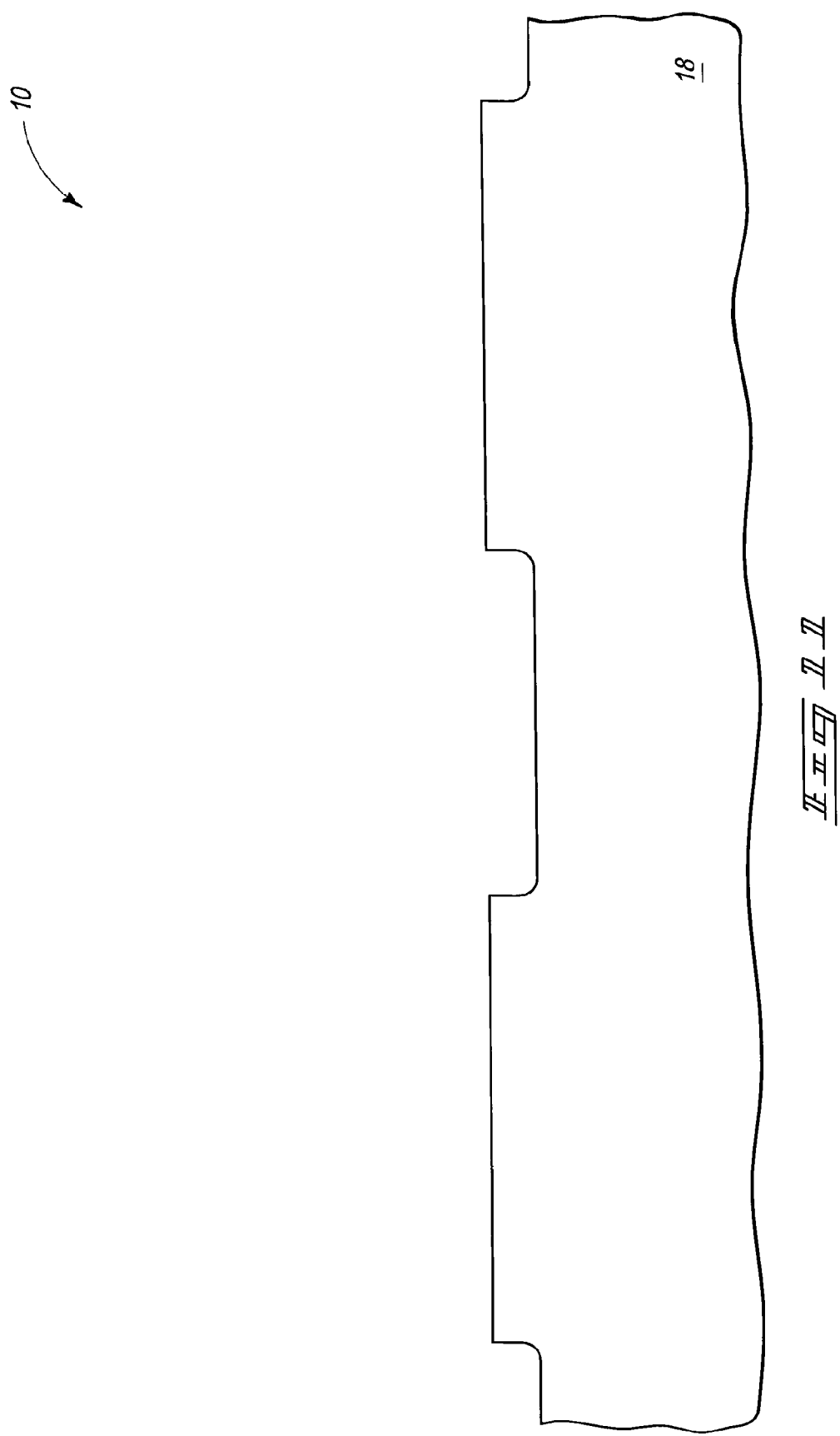
FIG. 11 is a view of the FIG. 10 substrate fragment at a processing step subsequent to that shown by FIG. 10.

Regardless, the patterned construction encompassed by FIG. 9 may be used as an alignment mark as-is, or processed subsequently in the fabrication of an alignment mark. For example, features 44 in FIG. 9 and/or the spaces there-between may be used as a scribe line alignment mark. Alternately, in one example, features 44 may be used as an etch mask while etching into exposed substrate material 18 within scribe line area which is received between features 44. Such is shown by way of example in FIG. 10 by conducting an example timed etch. If desired, some or all of remaining second features 44 may be subsequently removed from the substrate, for example as shown in FIG. 11 and whereby the raised and/or trench features of FIG. 11 may be used as a scribe line alignment mark. Regardless, when spacers/features 27, 28, 29, 30 are sub-lithographic in maximum width, alignment mark definition and placement in the above described manners may result in greater accuracy. Additionally, the quality of the resultant alignment mark (lacking in edge roughness and having better size uniformity) may be significantly improved over what would otherwise occur at the pitch multiplied level alone.

Figure 12:
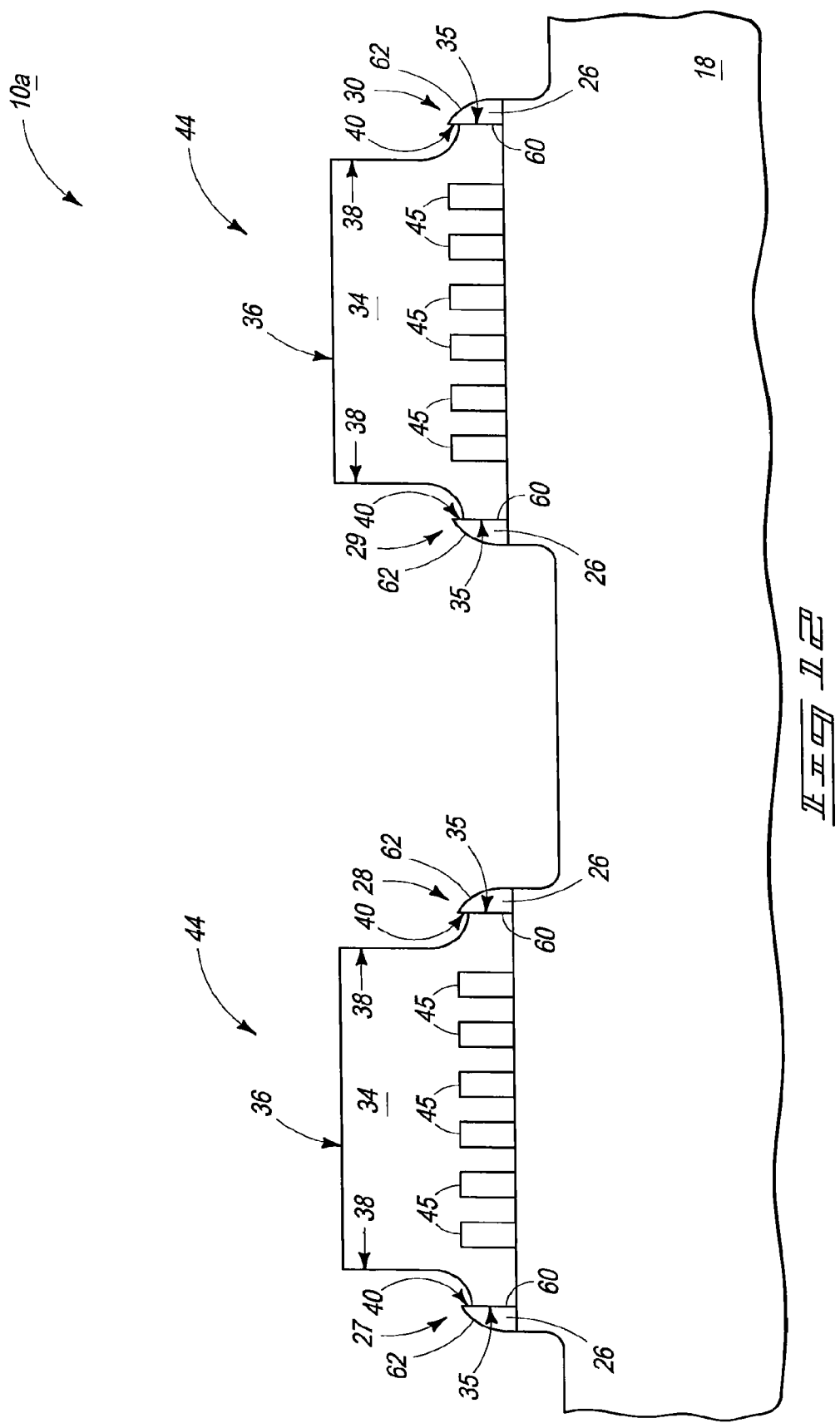
FIG. 12 is a diagrammatic sectional view of another semiconductor substrate fragment in process in accordance with an embodiment of the invention.

The above example embodiments depict substrate fragment 10 as having no raised features that were formed between the respective pairs 27/28 and 29/30 of features/spacers 27, 28, 29, 30. An alternate embodiment substrate fragment 10*a* is shown in FIG. 12. Like numerals from the above-described embodiments have been utilized where appropriate, with differences being indicated with the suffix "a" or with different numerals. Substrate 10*a* in FIG. 12 is depicted as comprising a plurality of raised features 45 which are received between the respective pairs of features 27/28 and 29/30. Such may be of the same or different configuration relative to each other, and/or relative to example features 27, 28, 29, 30. Additionally or alternately, trench or other recessed features might be formed between the respective pairs 27/28 and 29/30.

FIGS. 1-12 depict an example embodiment wherein pitch multiplied non-circuitry features 27/28 and 29/30 in top view comprise rings (FIG. 6). Any alternate configuration or structure is also contemplated, and whether existing or yet-to-be developed. The above FIGS. 1-12 embodiments also depict an example wherein largely rectangular photoresist blocks 20, 22 have been used. Any alternate shape or configuration may be used. One example alternate is next described with reference to FIGS. 13-20 with respect to a substrate fragment 10*b*. Like numerals from the above-described embodiments have been utilized where appropriate, with differences being indicated with the suffix "b" or with different numerals.

Figure 13:
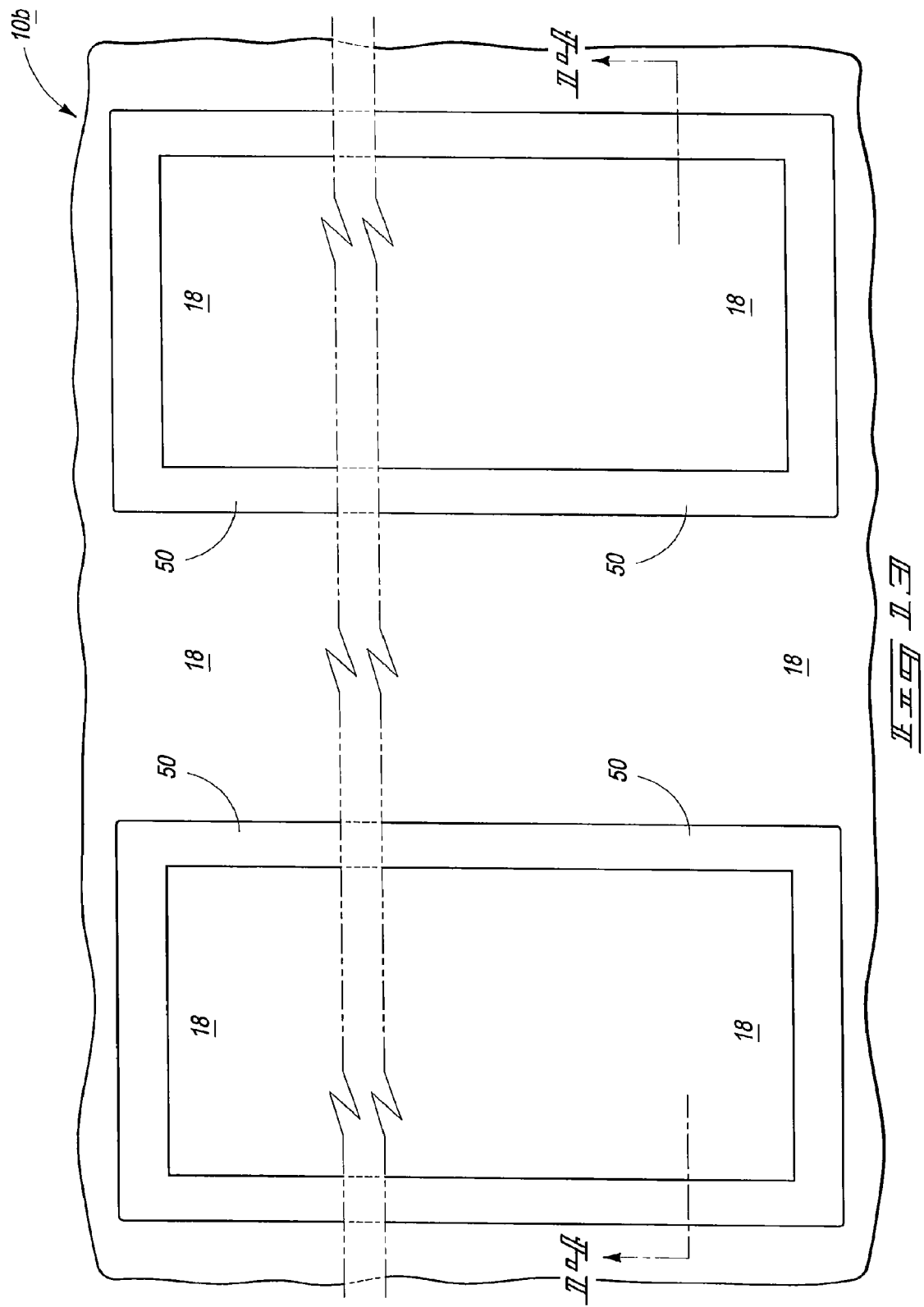
FIG. 13 is a diagrammatic top plan view of another semiconductor substrate fragment in process in accordance with an embodiment of the invention.
Figure 14:
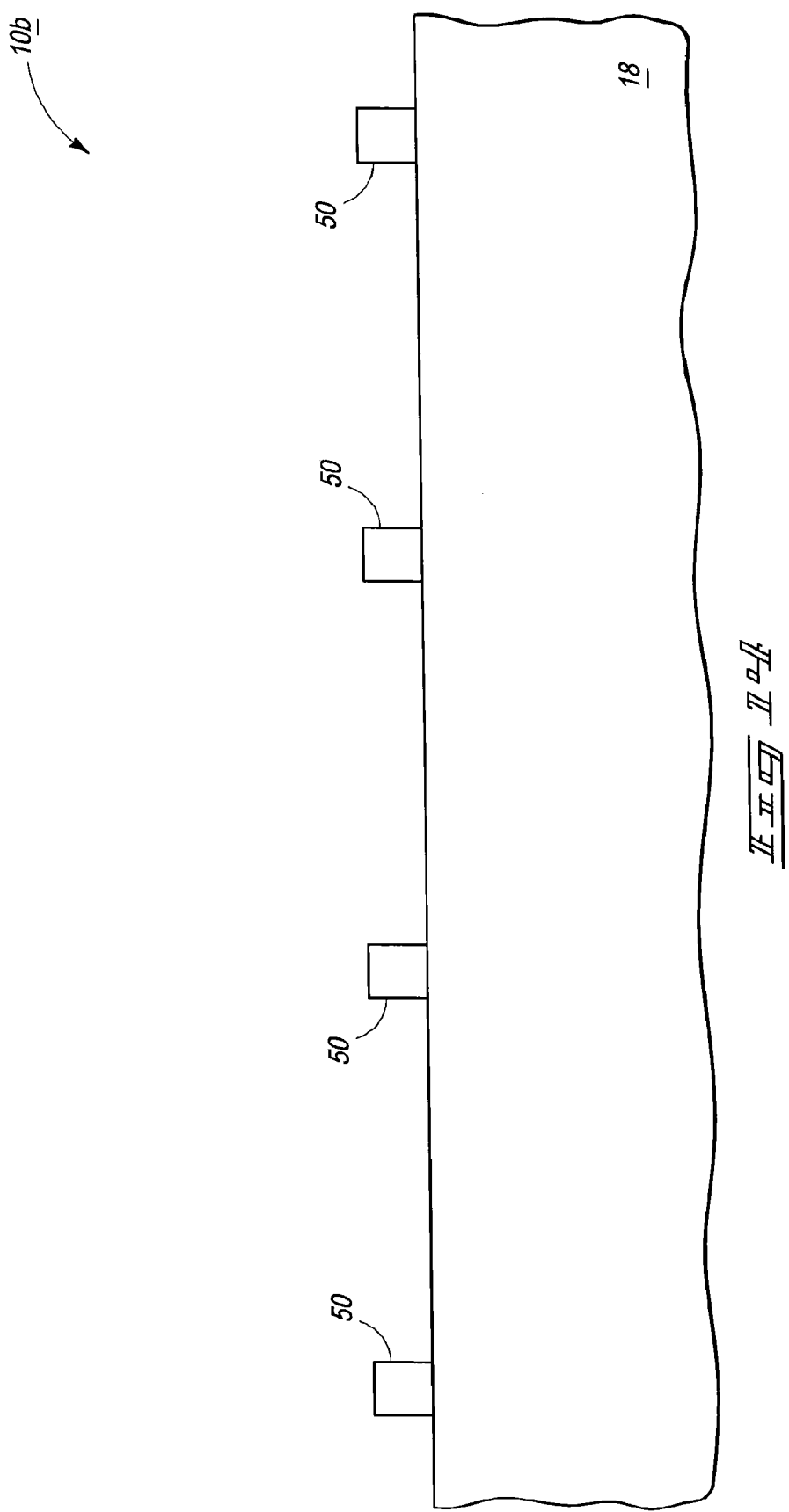
FIG. 14 is a sectional view taken through line 14-14 in FIG. 13.

Referring to FIGS. 13 and 14, rings 50 of first photoresist have been formed over substrate 18.

Figure 15:
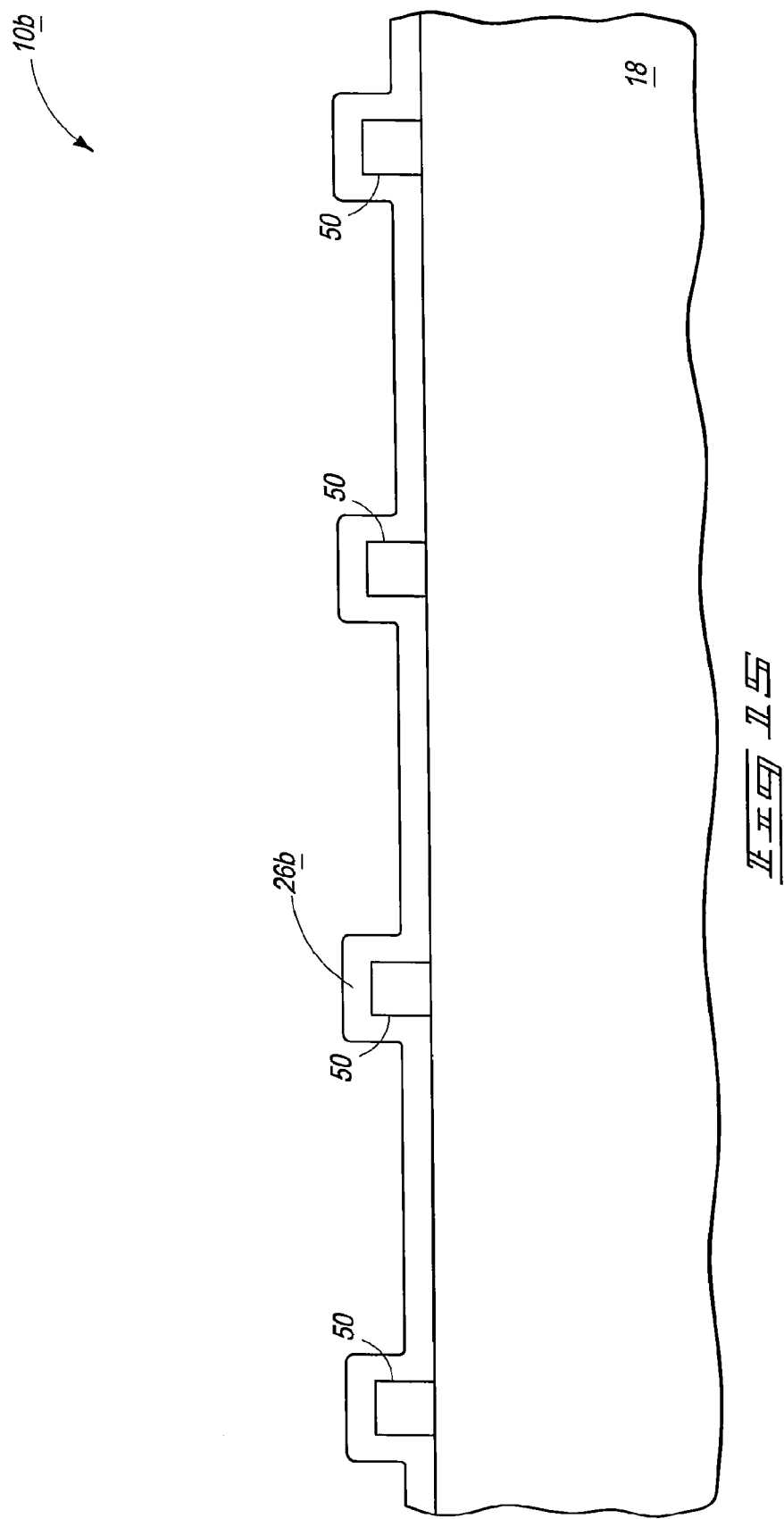
FIG. 15 is a view of the FIG. 14 substrate fragment at a processing step subsequent to that shown by FIG. 14.

Referring to FIG. 15, material 26*b* has been deposited over first photoresist rings 50. Such may, by way of example, be the same composition and thickness as material 26 in the above-described embodiments.

Figure 16:
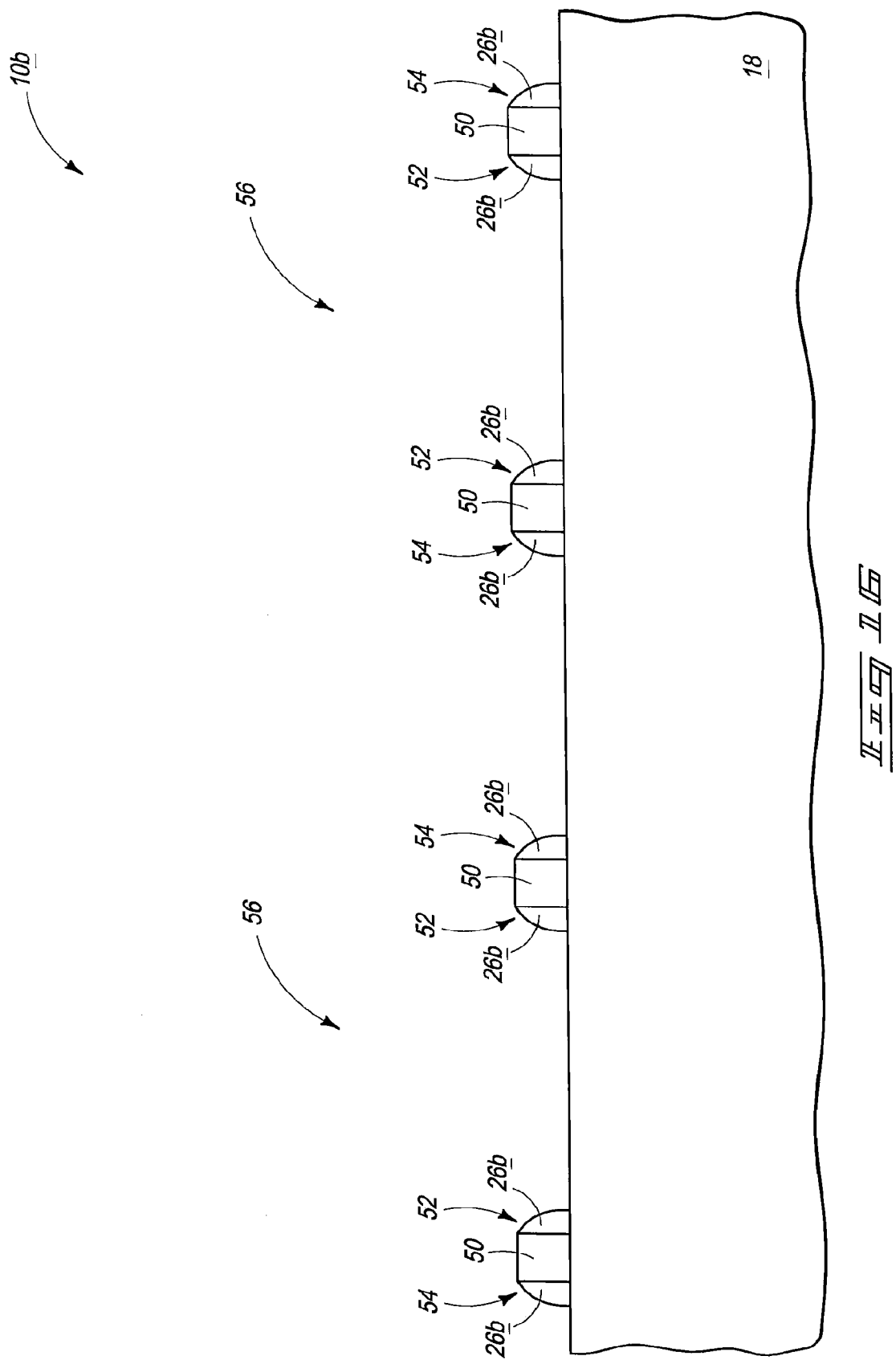
FIG. 16 is a view of the FIG. 15 substrate fragment at a processing step subsequent to that shown by FIG. 15, and taken through line 16-16 in FIG. 17.
Figure 17:
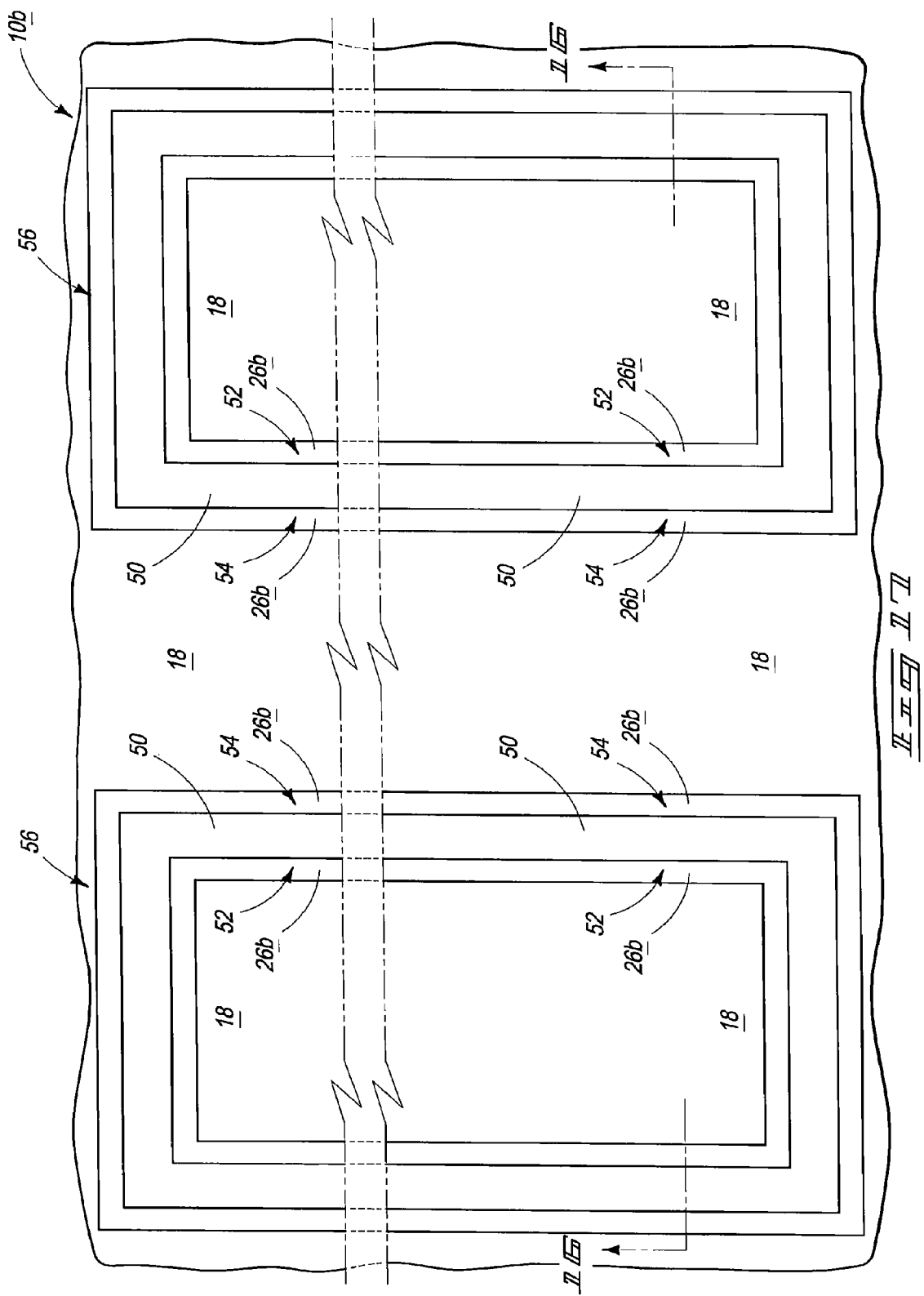
FIG. 17 is a diagrammatic top plan view of the FIG. 16 substrate fragment at a processing step subsequent to that shown by FIG. 16.

Referring to FIGS. 16 and 17, material 26*b* has been anisotropically etched to form inner spacer rings 52 and outer spacer rings 54 about first photoresist rings 50. Accordingly, first features 56 are formed which respectively comprise a first photoresist ring 50, an inner spacer ring 52, and an outer spacer ring 54. Inner spacer ring 52 and/or outer spacer ring 54 in cross-section may each have a respective maximum width which is less than a minimum photolithographic feature dimension used in lithographically patterning the substrate.

Figure 18:
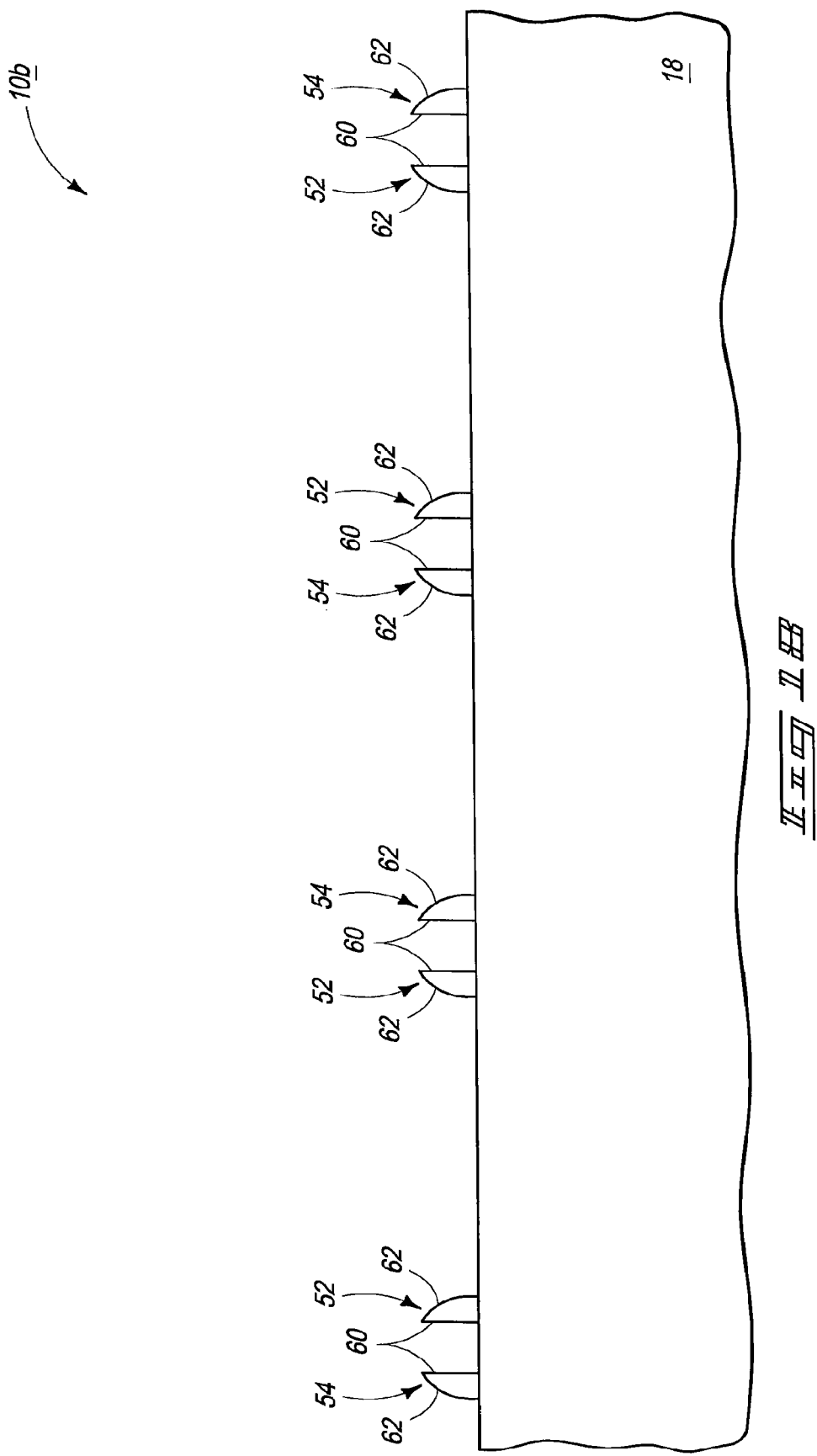
FIG. 18 is a sectional view of the FIG. 16 substrate at a processing step subsequent to that shown by FIG. 16.

Referring to FIG. 18, first photoresist rings 50 (not shown) have been removed from between inner spacer rings 52 and outer spacer rings 54.

Figure 19:
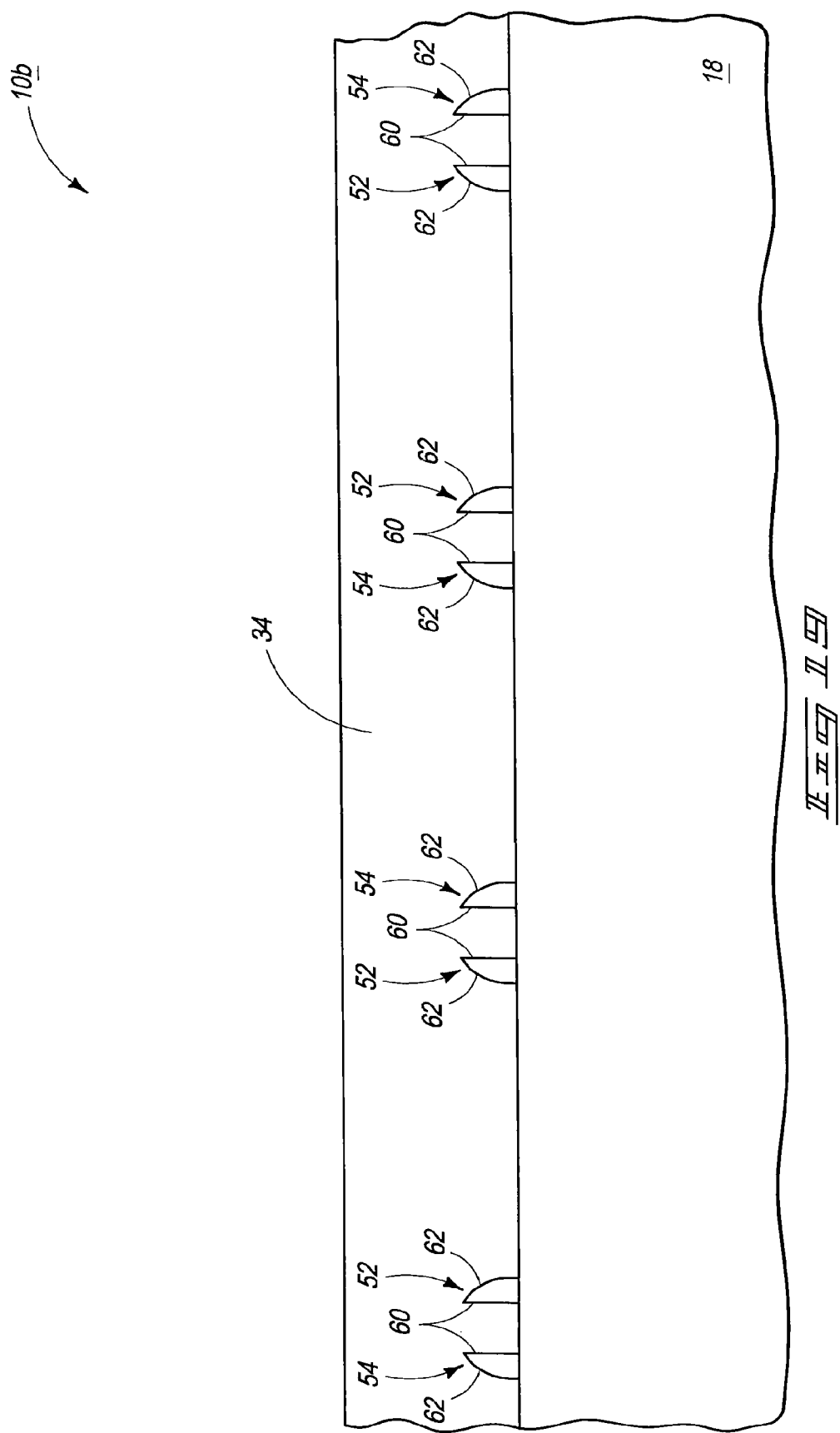
FIG. 19 is a view of the FIG. 18 substrate fragment at a processing step subsequent to that shown by FIG. 18.

Referring to FIG. 19, second photoresist 34 has been deposited over inner spacer rings 52 and outer spacer rings 54. Such is ultimately patterned to form non-circuitry second features within the scribe line area of the semiconductor substrate. Such second features in cross-section comprise photoresist blocks having laterally outermost opposing sidewalls that are respectively received against a sidewall of one of the inner and outer spacer rings.

Figure 20:
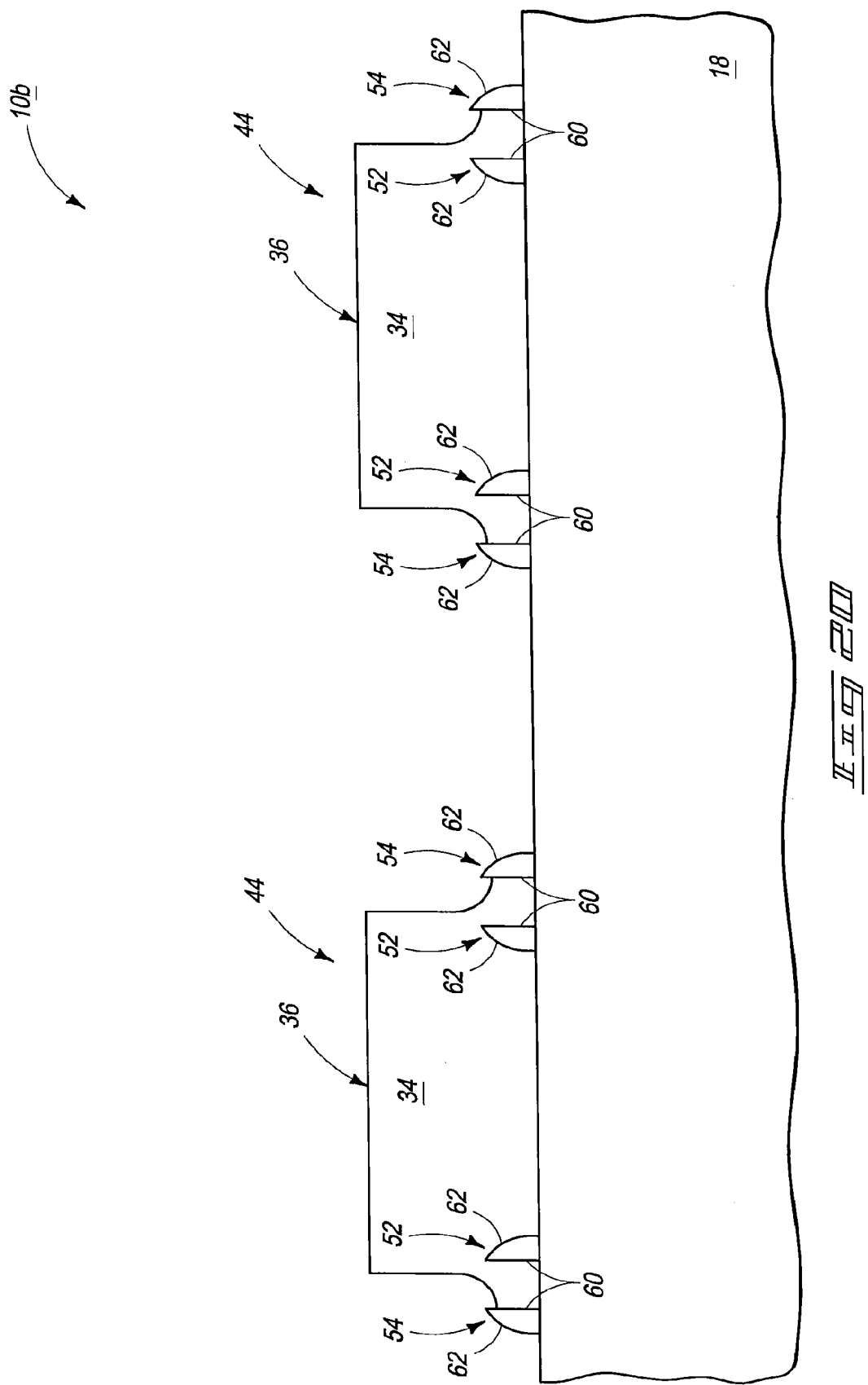
FIG. 20 is a view of the FIG. 19 substrate fragment at a processing step subsequent to that shown by FIG. 19.
Figure 21:
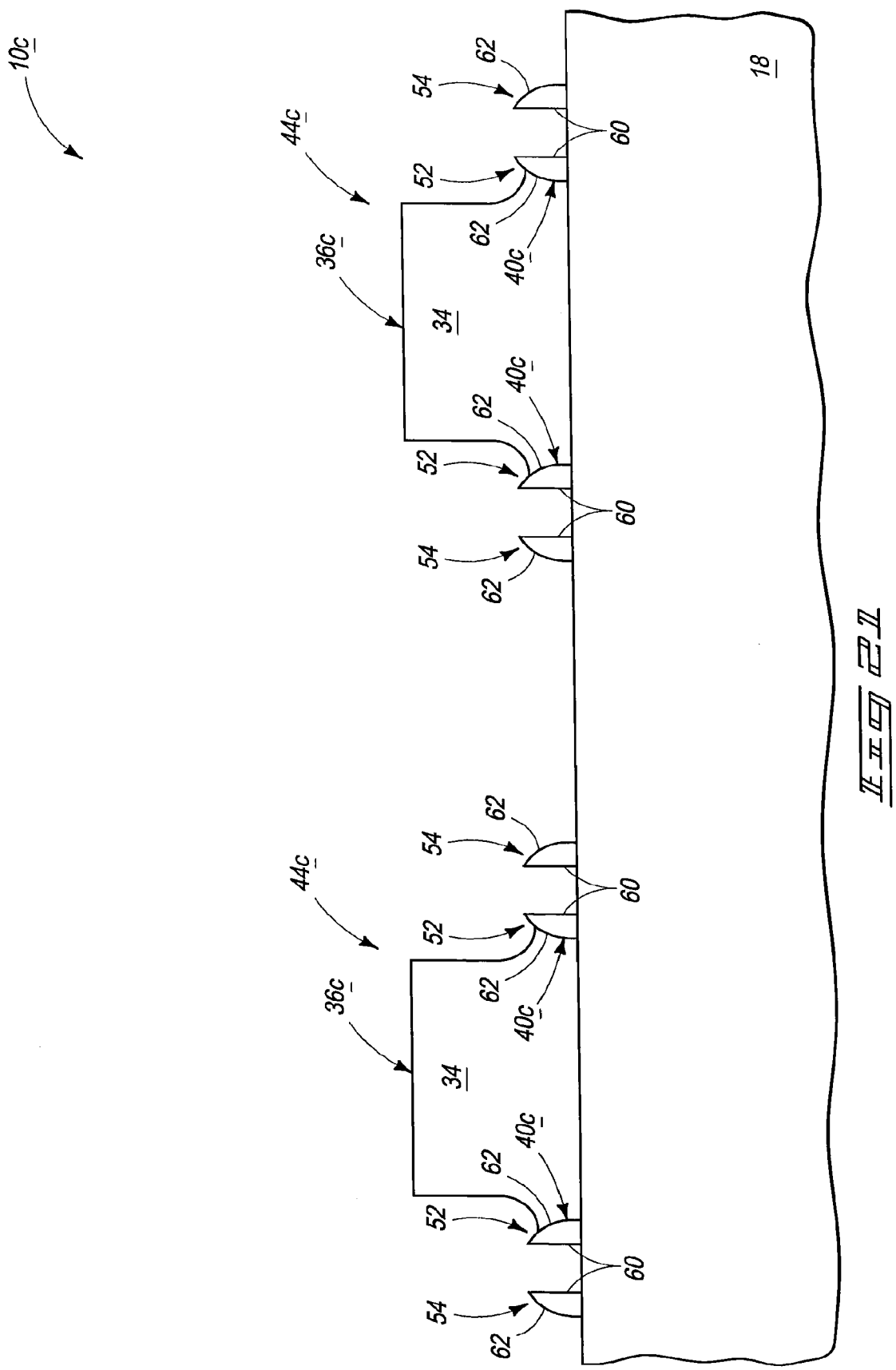
FIG. 21 is a diagrammatic sectional view of another semiconductor substrate fragment in process in accordance with an embodiment of the invention.

For example, FIG. 20 shows patterning of second photoresist 34 to form non-circuitry second features 44. Such in cross-section comprise photoresist blocks 36 respectively having laterally outermost opposing sidewalls 40 that are respectively received against outer spacer rings 54. FIG. 21 illustrates an alternate embodiment substrate fragment 10*c* wherein laterally outermost opposing sidewalls 40*c* of photoresist blocks 36*c* are received against a sidewall of inner spacer rings 52. Like numerals from the above-described embodiments have been utilized where appropriate, with differences being indicated with the suffix "c".

Figure 22:
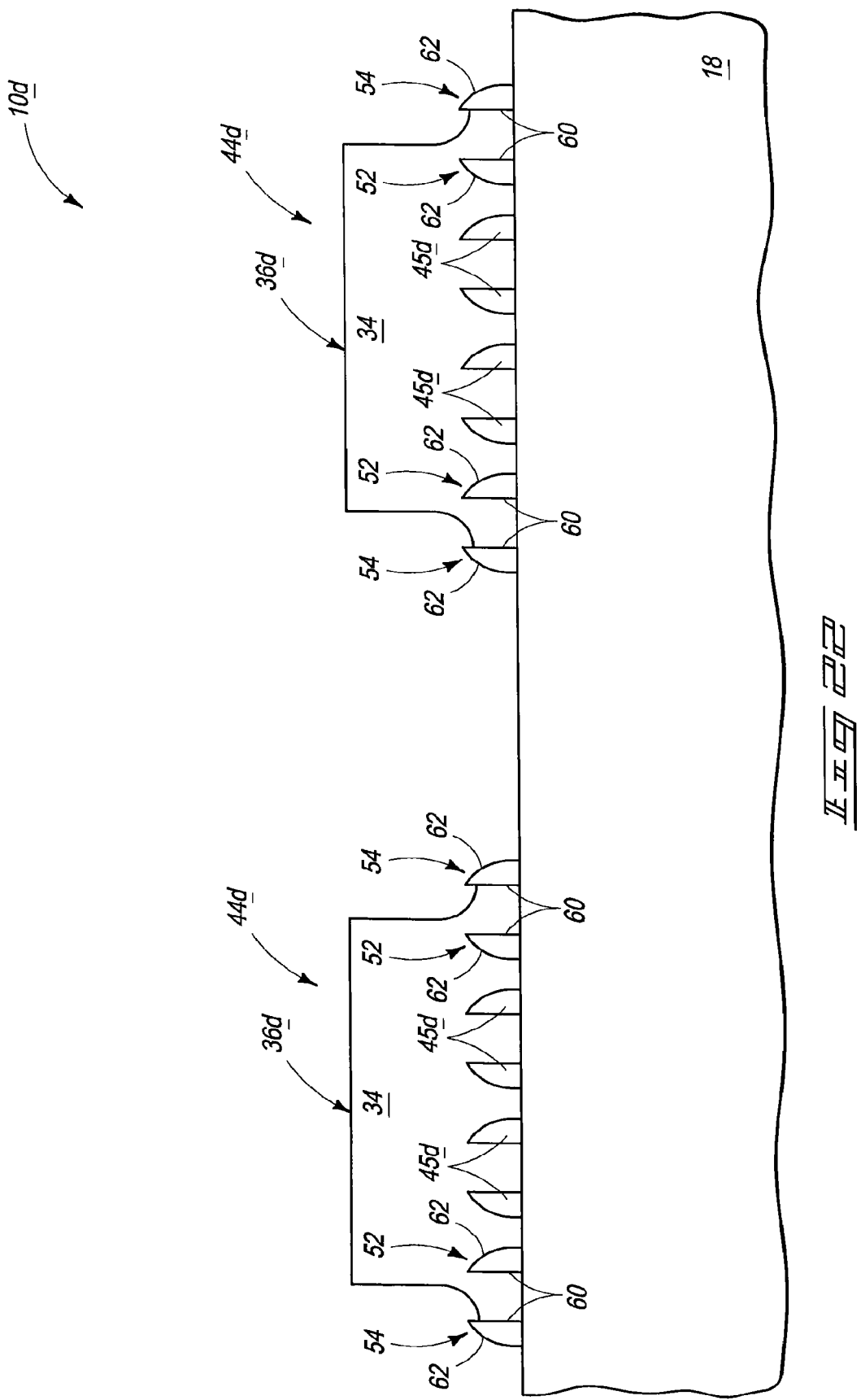
FIG. 22 is a diagrammatic sectional view of another semiconductor substrate fragment in process in accordance with an embodiment of the invention.

Regardless, as with the first described embodiments, raised or recessed features may be formed between the spaced features. For example, features may be formed radially within inner spacer rings 52 and over which the second photoresist is deposited. FIG. 22 shows such an example alternate embodiment substrate fragment 10*d* comprising raised features 45*d* received radially between features 52. Like numerals from the above-described embodiment have been utilized where appropriate, with structural differences being indicated with the suffix "d".

In one embodiment, a method of processing a semiconductor substrate in forming scribe line alignment marks comprises forming non-circuitry features within scribe line area of a semiconductor substrate. Individual of the features in cross-section comprise a straight sidewall and an opposing curved sidewall. The curved sidewalls of first pairs of immediately adjacent features face one another, while the straight sidewalls of second pairs of immediately adjacent features face one another. For example with reference to FIG. 7, features 27, 28, 29, 30 are shown as respectively comprising a straight sidewall 60 and opposing curved sidewall 62. Some portions of sidewalls 62 may also be straight, while other portions are curved. Curved sidewalls 62 of a first pair 28/29 of immediately adjacent features face one another, while straight sidewalls 60 of second pairs 27/28 and 29/30 of immediately adjacent features face one another. Analogously with reference to FIG. 18, straight sidewalls 60 and curved sidewalls 62 are shown with respect to the depicted features 52, 54 in the FIG. 18 cross-section.

Photoresist is deposited over the features, for example, as shown in each of FIGS. 8 and 19.

The photoresist is patterned to form photoresist blocks that are individually received between a respective two of the features in the cross-section. The patterning forms individual of the photoresist blocks to have an opposing pair of laterally outermost edges in the cross-section that are one of a) against the straight sidewalls of each feature of the respective two features, or b) against the curved sidewalls of each feature of the respective two features. For example, each of the FIGS. 9, 20 and 22 embodiments form the opposing pairs of laterally outermost edges of the photoresist blocks in the depicted cross-sections to be received against straight sidewall 60 of each feature of the respective two features between which each block is received. FIG. 21 depicts an alternate embodiment wherein the respective opposing pairs of laterally outermost edges of the photoresist blocks in the cross-section are received against the curved sidewalls of each feature of the respective two features between which the photoresist blocks are received.

In one embodiment, a method of processing a semiconductor substrate in forming scribe line alignment marks includes forming non-circuitry features within scribe line area of a semiconductor substrate. Individual of the features in cross-section comprise a photoresist block having a laterally outermost sidewall. Further, individual of the features comprise a spacer received laterally over each of the laterally outermost sidewalls in the cross-section. Additionally, individual of the spacers have a maximum width which is less than a minimum photolithographic feature dimension used in lithographically patterning the substrate. Example substrates include those of FIGS. 9, 12, 20, 21 and 22 regardless of whether first pattern edges 38 are present.

The photoresist blocks and the spacers of the features are used as an etch mask while etching into substrate material received between the features. FIG. 10 depicts one example. The same etch processing of FIG. 10 may be conducted relative to substrate material 18 in any of FIGS. 20, 21 and 22. Regardless, after the etching, remaining of the photoresist blocks and spacers are removed from the scribe line area. Such is by way of example only depicted in FIG. 11.

In compliance with the statute, the subject matter disclosed herein has been described in language more or less specific as to structural and methodical features. It is to be understood, however, that the claims are not limited to the specific features shown and describe, since the means herein disclosed comprise example embodiments. The claims are thus to be afforded full scope as literally worded, and to be appropriately interpreted in accordance with the doctrine of equivalents.

The invention claimed is:

1. A method of processing a semiconductor substrate in forming scribe line alignment marks, comprising:
   forming non-circuitry first features within scribe line area of a semiconductor substrate, the first features in cross-section comprising first photoresist blocks respectively having opposing laterally outermost sidewalls and a spacer received against each laterally outermost sidewall of the first photoresist blocks;
   removing the first photoresist blocks from the substrate;
   after removing the first photoresist blocks, depositing a second photoresist over the spacers and over die area of the semiconductor substrate; and
   patterning the second photoresist to form non-circuitry second features within the scribe line area of the semiconductor substrate, the second features in the cross-section comprising second photoresist blocks having laterally outermost opposing sidewalls, respective ones of the spacers formerly received against one of the laterally outermost sidewalls of the first photoresist blocks being received against respective opposing laterally outermost sidewalls of the second photoresist blocks in the cross-section, said patterning comprising:
      simultaneously patterning the second photoresist over the die area for formation of integrated circuit components while patterning the second photoresist to form the second photoresist blocks in the scribe line area.

2. The method of claim 1 wherein individual of the spacers in the cross-section have a maximum width which is less than a minimum photolithographic feature dimension used in lithographically patterning the substrate.

3. The method of claim 1 comprising after the simultaneously patterning, using the second features as an etch mask while etching into exposed substrate material within the scribe line area which is received between the second features.

4. The method of claim 3 comprising removing remaining of the second features from the scribe line area after the etching.

5. The method of claim 1 wherein the second photoresist is of the same composition as the photoresist of the first photoresist blocks.

6. The method of claim 1 wherein the second photoresist and the photoresist of the first photoresist blocks are of different composition.

7. The method of claim 1 comprising after the simultaneously patterning, etching into exposed substrate material within the scribe line area.

* * * * *